(12) United States Patent
Alloatti

(10) Patent No.: US 10,331,842 B2
(45) Date of Patent: Jun. 25, 2019

(54) METHODS AND APPARATUS FOR AUTOMATED DESIGN OF SEMICONDUCTOR PHOTONIC DEVICES

(71) Applicant: Massachusetts Institute of Technology, Cambridge, MA (US)

(72) Inventor: Luca Alloatti, Staefa (CH)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 536 days.

(21) Appl. No.: 14/972,007

(22) Filed: Dec. 16, 2015

(65) Prior Publication Data

US 2016/0171149 A1 Jun. 16, 2016

Related U.S. Application Data

(60) Provisional application No. 62/092,376, filed on Dec. 16, 2014.

(51) Int. Cl.
  *G06F 17/50* (2006.01)
(52) U.S. Cl.
  CPC ...... *G06F 17/5081* (2013.01); *G06F 17/5072* (2013.01)
(58) Field of Classification Search
  USPC .......................................................... 716/52
  See application file for complete search history.

(56) References Cited

U.S. PATENT DOCUMENTS

| | | | |
|---|---|---|---|
| 6,574,786 B1 * | 6/2003 | Pohlenz | G06F 17/5068 716/112 |
| 6,775,806 B2 | 8/2004 | Li | |
| 6,782,516 B2 | 8/2004 | Rittman et al. | |
| 6,782,517 B2 | 8/2004 | Rittman et al. | |
| 8,146,037 B2 | 3/2012 | Pelham et al. | |

(Continued)

OTHER PUBLICATIONS

Poulton, Christopher V.; Zeng, Xiaoge; Wade, Mark T.; Shainline, Jeffrey M.; Orcutt, Jason S.; Popovic, Milos A.; "Photonic Crystal Microcavities in a Microelectronics 45 nm SOI CMOS Technology," Oct. 2014, IEEE Photonics Technology Letters.*

(Continued)

*Primary Examiner* — Eric D Lee
(74) *Attorney, Agent, or Firm* — Smith Baluch LLP

(57) ABSTRACT

A photonic design automation (PDA) tool to facilitate design of semiconductor photonic devices is described. In one example, the PDA tool includes a process design library including one or more photonics parameterized cells (pCells), a plurality of processor-executable photonics design functions including a design rule check (DRC) violation removal function, and a semiconductor technology-dependent parameter file including a plurality of design rules that define allowed semiconductor design patterns to be converted to a plurality of semiconductor fabrication mask designs in a first semiconductor technology. The PDA tool supports a graphical user interface (GUI) to provide access to the library of photonic pCells to create intuitive physical property layers for a photonic device, and processes the physical property layers using the DRC violation removal function and the design rules to automatically generate a plurality of mask design layers for a "DRC clean" physical layout of the photonics device.

73 Claims, 24 Drawing Sheets

(56) References Cited

U.S. PATENT DOCUMENTS

| | | | |
|---|---|---|---|
| 8,492,205 B2 | 7/2013 | Houston et al. | |
| 8,799,834 B1 | 8/2014 | Chen et al. | |
| 9,000,529 B1 | 4/2015 | Jain et al. | |
| 2006/0253813 A1 | 11/2006 | Rittman | |
| 2014/0007032 A1* | 1/2014 | Acar | G06F 17/5081 |
| | | | 716/112 |
| 2016/0055289 A1* | 2/2016 | Cao | G06F 17/5081 |
| | | | 716/112 |

OTHER PUBLICATIONS

Alloatti, L. et al., "Photonics design tool for advanced CMOS nodes", IET Optoelectron, vol. 9, Issue 4, (2015), pp. 163-167.

Arriordaz, A., et al., "Improvements in the silicon photonics design flow: collaboration and standardization", 2014 IEEE Photonics Conference (IPC), Oct. 12-16, 2014, pp. 63-64.

Assefa, S., et al., "A 90nm CMOS Integrated Nono-Photonics Technology for 25Gbps WDM Optical Communications Applications," 2012 IEEE International Electron Devices Meeting (IEDM), IEEE, Dec. 10-12, 2012, 3 pages.

Bogaerts, W. et al., Design Challenges in Silicon Photonics, IEEE Journal of Selected Topics on Quantum Electronics, vol. 20, No. 4, Jul./Aug. 2014, pp. 1-8.

Cadence Tutorial 2: Layout, DRC/LVC and Circuit Simulation with Extracted Parasitics, pp. 1-6.

Condrat, C. et al., Crossing-Aware Channel Routing for Integrated Optics, IEEE Trans. on CAD, vol. 33, No. 5, special section on Optical Interconnects, Jun. 2014, pp. 814-825.

Fiers, M. et al., "Improving the design cycle for nanophotonic components", Journal of Computer Science, vol. 4, Jun. 5, 2013, pp. 313-324.

Georgas, M. et al., "A monolithically-Integrated Optical Transmitter and Receiver in a Zero-Change 45nm SOI Process," IEEE Jun. 10-13, 2014 Symposium on VLSI Circuits Digest of Technical Papers, pp. 1-2.

Gunn, C., "Fully integrated VLSI CMOS and Photonics CMOS Photonocs" 2007 IEEE Symposium on VLSI Technology, Jun. 12-14, 2007, pp. 6-9.

Mead, C. et al., "Introduction to VLSI systems" (Addison Wesley), Dec. 1979, 257 pages.

Orcutt, J. S., et al., Photonic Device Layout Within the Foundry CMOS Design Environment, IEEE Photonics Technology Letters, vol. 22, No. 8, Apr. 15, 2010, pp. 544-546.

Orcutt, J. S. et al., "Nanophotonic Integration in state-of-the-art CMOS foundries," Optics Express vol. 19, Jan. 31, 2011, pp. 2335-2346.

Orcutt, J. S., et al., Monolithic Electronic-Photonic Integration in State-Of-the-Art CMOS Processes, PhD. Thesis, MIT, Feb. 2012, 407 pages.

Shainline, J. M. et al., "Depletion-mode carrier-plasma optical modulator in zero-change advanced CMOS," Optics Letters, vol. 38, Aug. 1, 2013, pp. 2657-2659.

Young, I.A. et al., "Optical Technology for Energy Efficient I/O in High Performance Computing,"IEEE Communications Magazine, vol. 48, Oct. 2010, pp. 184-191.

Imec Services & Solutions, taken from http://www2.imec.be/be_en/services-and-solution/silicon-photonics.html. Dec. 9, 2015, 1 page.

IHP Si Photonics, taken from http://www.Ihp-microelectronics.com/en/research/technology/si-photonics.html. Dec. 9, 2015, 2 pages.

Cea Leti, taken from http://www.letl.cea.fr., Dec. 9, 2015, 1 page.

Tyndall National Institute, taken from http://www.tyndall.ie. , Dec. 9, 2015, 1 page.

IME, Institute of Microelectronics, taken from http://www.a-star.edu.sg/ime., Dec. 9, 2015, 2 pages.

The MOSIS Service, taken form https://www.mosis.com., Dec. 9, 2015, 1 page.

Lumerical Interconnect, taken from https://www.lumerical.com/tcad-products/interconnect., Dec. 9, 2015, 2 pages.

IPKISS, taken from http://www.ipkiss.org., Dec. 9, 2015, 8 pages.

Luceda Photonics: taken from http://www.lucedaphotonics.com, Dec. 9, 2015, 3 pages.

Phoenix, taken from http://www.phoenixbv.com/index.php., Dec. 9, 2015, 1 page.

Custom IC Design—MentorGraphics, taken from http://www.mentor.com., Dec. 9, 2015, 2 pages.

Kallistos, taken from http://www.photond.com/products/kallistos.htm., Dec. 9, 2015, 2 pages.

Vpiphotonics, taken from http://www.vpiphotonics.com/Index.php., Dec. 9, 2015, 1 page.

WieWeb software, taken from http://wieweb.com., Dec. 10, 2015, 3 pages.

Aspic advanced Simulator for photonic Integrated Circuits, taken from http://www.aspicdesign.com., Dec. 10, 2014, 14 pages.

Pyxis from Custom IC Design, taken from http://www.mentor.com/products/ic_nanometer_design/custom-ic-design/, Dec. 10, 2015, 2 pages.

* cited by examiner

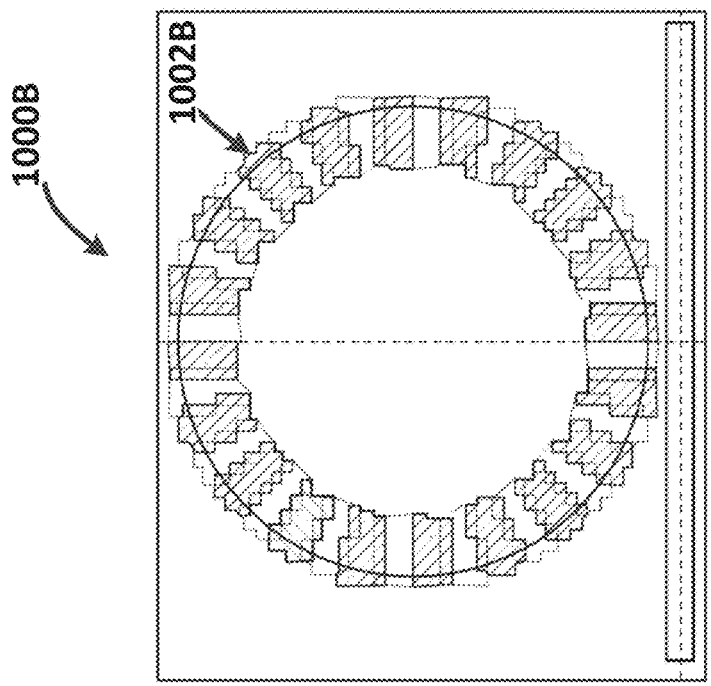
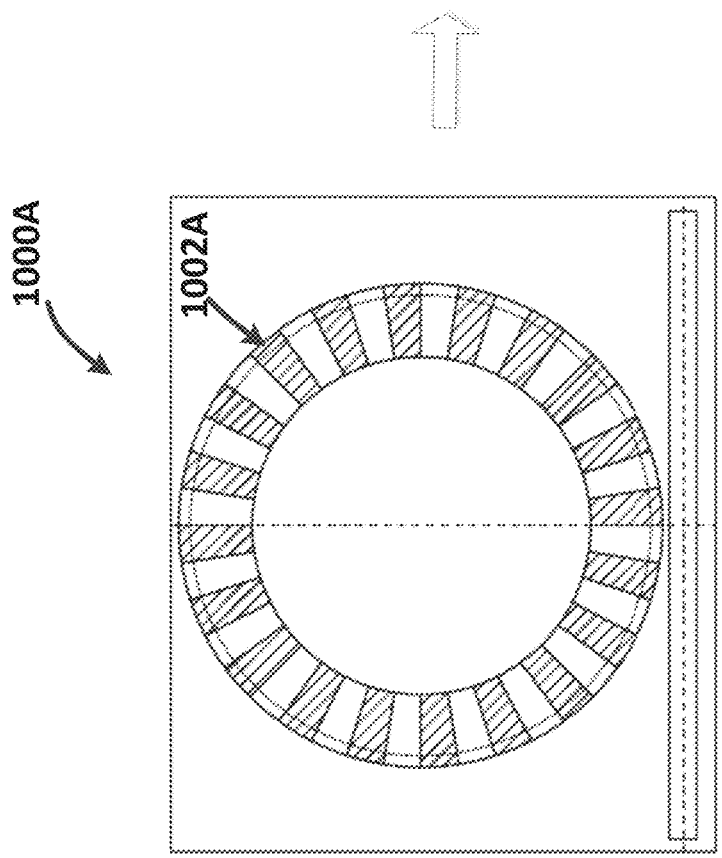
FIG 10B
FIG 10A

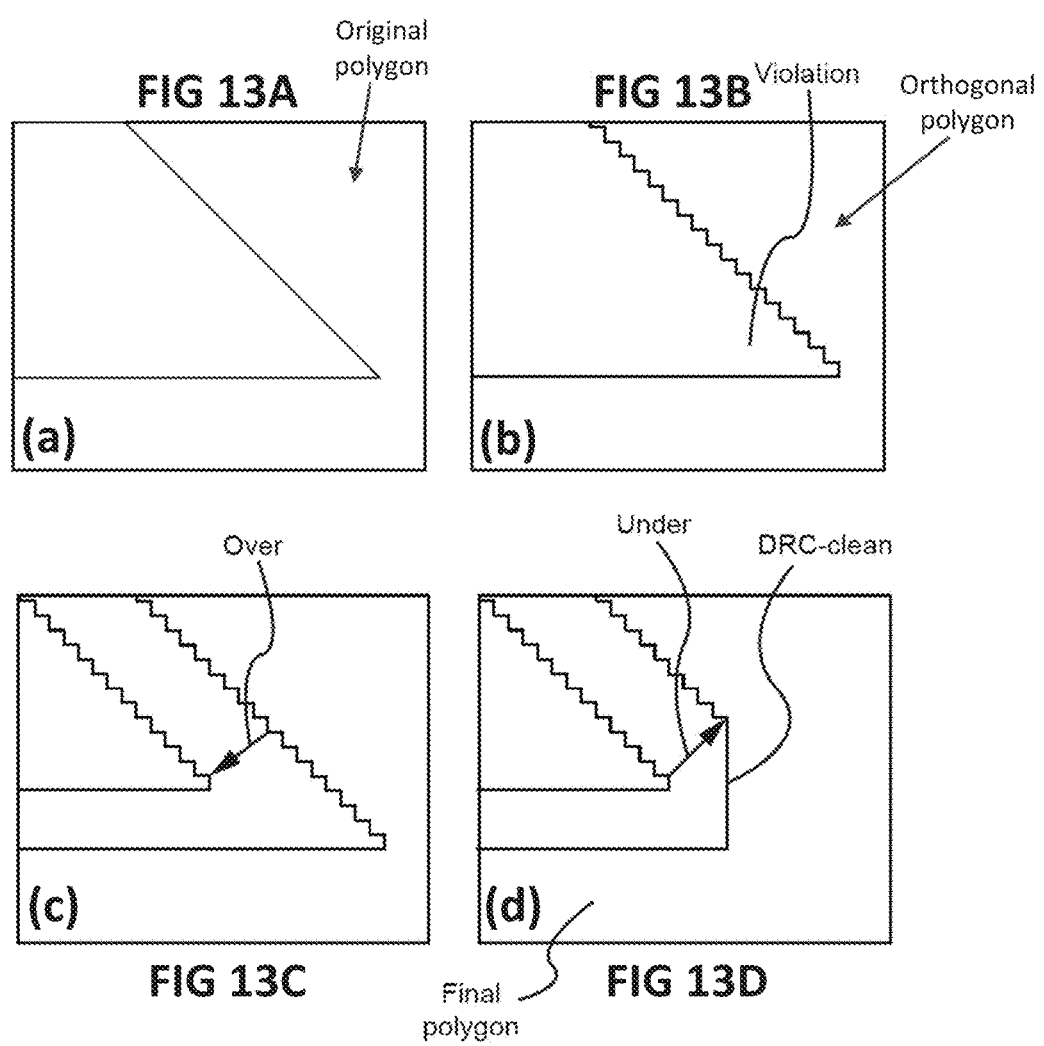

```
 7  pcDefinePCell
 8    list ( ddGetObj (strcat (svv (PROJECT_NAME) "_" env (USER)))
 9    ; parameters and their optional defaults
10    (
11      (ROut                    5.0)
12      (RingWidth               1.200)
13      (Wr Width                0.480)
14      (SlotWidth               0.270)
15      (SpokeN                  36)
16      (SpokeWidthPercentage    100.0)
17      (NWellLpp                list ("nwlphos" "drawing"))
18      (PwellLpp                list ("pwelphos" "drawing"))
19      (GSPick                  "YES")
20    ) ; end of parameter list
```

FIG 18

METHODS AND APPARATUS FOR AUTOMATED DESIGN OF SEMICONDUCTOR PHOTONIC DEVICES

CROSS-REFERENCE TO RELATED PATENT APPLICATION

This application claims priority, under 35 U.S.C. § 119(e), from U.S. Application No. 62/092,376, filed Dec. 16, 2014 and titled "Photonic Design Automation Tool," which application is hereby incorporated herein by reference in its entirety.

GOVERNMENT SUPPORT

This invention was made with government support under Contract No. HR0011/11/C-0100 awarded by the Defense Advanced Research Projects Agency. The government has certain rights in the invention.

BACKGROUND

Semiconductor devices are made in foundries, of which there are over a hundred worldwide (operated by approximately two dozen or so semiconductor companies adopting a foundry model). Fabrication of large-scale integrated semiconductor devices requires multiple process steps and mask layers that define etching and deposition patterns (e.g., for photoresists), dopant implants, and metallization. A semiconductor foundry may employ a particular set of process steps and mask layers for a given semiconductor device, and process steps/mask layers can differ significantly for different types of semiconductor devices (as well as similar devices made by different foundries). A particular set of process steps and mask layers employed by a given foundry to fabricate any of a variety of semiconductor devices is generally referred to as a "semiconductor manufacturing process technology" (or simply "semiconductor technology"). For fabrication of Complimentary-Metal-Oxide-Semiconductor (CMOS) devices, different manufacturing process technologies are sometimes commonly referred to as "CMOS technology nodes." Some common examples of conventional CMOS technology nodes include a 45 nanometer silicon-on-insulator (SOI) process technology available from IBM (i.e., the IBM SOI12SO 45 nm technology), as well as the IBM SOI12SO 32 nm technology and the IBM 10LPE technology.

For each different semiconductor technology, a set of "design rules" is provided that includes a series of parameters specifying certain geometric and connectivity restrictions in connection with the manufactured semiconductor devices using a particular technology. Such design rules are based on the available process steps and mask layers in the given semiconductor technology, and provide sufficient margins to account for variability in the process steps used in the technology. Thus, design rules define allowed semiconductor design patterns to be converted to mask designs for the physical layout of a device in a given semiconductor technology. The specification of such technology-dependent design rules ensures reasonably predictable and sufficiently high yields for semiconductor device manufacturing using the given semiconductor technology (e.g., billions to trillions of nanoscale components can be fabricated simultaneously with high yield and performance).

Some examples of common design rules employed in a variety of conventional semiconductor technologies include "single layer rules" that specify geometric and connectivity restrictions on a given layer of a multi-layer semiconductor design. Examples of single layer rules include a "minimum size rule" that defines one or more minimum dimensions of any feature or object in a given layer of the design (e.g., a "width rule" that specifies the minimum width, in a plane parallel to the semiconductor substrate, of a feature or object in the design), and a "minimum spacing rule" that specifies a minimum distance between two adjacent features/objects in a given layer. Other examples of single layer rules relate to polygon-shaped elements, and include minimum/maximum area and allowed orientations of polygon edges. Other types of conventional design rules include "two layer rules" (specifying certain relationships that must exist between two layers, such as distance, extension or overlap between two or more layers). Design rule sets have become increasingly more complex with successive generations of semiconductor technologies.

Semiconductor devices conventionally are designed initially using "electronic design automation (EDA) tools," which are a category of GUI-oriented software-based tools that support a design flow for facilitating the complete design and preliminary analysis of an entire semiconductor chip. Given the computer-aided-design functionality of EDA tools, they are also sometimes referred to as "electronic computer-aided design" (ECAD). These tools often rely on a "process design kit" (PDK) comprising a comprehensive library of parameterized "cells" that implement certain logic or other electronic functions. This facilitates a modular approach to design of electronic devices based on intuitive and standardized descriptions of various device elements and functions that may be compiled into invocations of cells. Libraries of such cells generally are provided for a given semiconductor technology together with a full description of electrical characteristics, physical dimensions and schematic representations all contained in the PDK, as well as simulation models. Examples of providers of EDA tools with well-developed and sophisticated PDKs for design of electronic devices include Synopsis, Cadence (which for example provides the "Virtuoso" EDA tool written in the SKILL language), Mentor Graphics, and Zuken.

By virtue of an EDA, electronic designers do not need to layout from scratch novel transistors or parameterized cells when creating designs for electronic devices to be fabricated in common CMOS semiconductor technologies. Rather, they may draw from an extensive library of parameterized cells in the PDK of the EDA to create designs for a large variety of integrated electronic devices. Moreover, these designs are automatically analyzed to ensure that, in the process of converting the designer's work into mask layers for the design of masks that will be used to manufacture the electronic device(s), no design rules are violated for the semiconductor technology being used—that is, the electronic designer's work is automatically analyzed and "cleaned" to ensure there are no violations of design rules associated with the semiconductor technology (i.e., there are no design rule check (DRC) violations).

SUMMARY

Although multiple advanced conventional EDA tools are available for the design of electronic semiconductor devices using a variety of conventional semiconductor manufacturing process technologies, there are very few tools for the design of photonic devices; in particular, there is no tool that provides a comprehensive photonics process design kit (PDK), advanced photonic design functionality, and automated generation of design rule compliant mask design layers for a physical layout of photonic devices or integrated photonic-electronic devices (i.e., such that the mask design layers are substantially free of any design rule check (DRC) violations).

To date, a dominant part of integrated photonics research has exploited silicon or InP foundries running customized fabrication processes for photonics which have offered photonic nanofabrication services and multi project wafer runs. The majority of these foundries, however, have offered a simplified CMOS manufacturing process technology without transistors, typically one to four masks, and a minimal number of design rules (that are "borrowed from" and pertain to electronic components). As a consequence, the majority of the photonic design tools developed to date focus on integrating electromagnetic simulation tools, waveguide routing, embedded behavioral models for system simulation, and scripted or graphical layout generation— that is, the physical layout for the photonic devices needs to be drawn manually by the photonics designer to be compliant with applicable design rules, which in many cases is a significantly time-consuming and error-prone task for the photonics designer.

In view of the foregoing, various inventive embodiments herein are directed to methods and apparatus for automated design of semiconductor photonic devices, as well as integrated photonic-electronic devices. For purposes of the present disclosure, the various inventive apparatus employed for the design of photonic or photonic-electronic devices, and the inventive photonics design methods, are sometimes referred to herein generally as "photonic design automation (PDA) tools."

As described herein, PDA tools based on apparatus and methods according to various embodiments significantly facilitate design of semiconductor photonics and integrated photonic-electronic devices using intuitive technology-independent design layers, which are then processed automatically to ensure that designs substantially avoid, or are free of, design rule violations given a particular semiconductor technology in which the devices will be manufactured. Moreover, in various embodiments, PDA tools may be effectively integrated with existing EDA tools to extend the EDA tools' capabilities to photonic device design; in this manner, the various inventive methods and apparatus described herein significantly facilitate the design of "zero-change CMOS photonic devices" using existing and proven conventional CMOS technologies. To this end, in one exemplary implementation of a PDA tool according to one embodiment, an expanded library of photonic parameterized cells, as well as specific photonic design functions, are written in the scripting language SKILL, which is the native scripting language of the EDA tool "Virtuoso" by Cadence®, such that Virtuoso can be effectively extended as a tool for designing photonic devices.

As described herein, a PDA tool according to one embodiment includes a process design library including one or more photonics parameterized cells (pCells), a plurality of processor-executable photonics design functions including a design rule check (DRC) violation removal function, and a semiconductor technology-dependent parameter file including a plurality of design rules that define allowed semiconductor design patterns to be converted to a plurality of semiconductor fabrication mask designs in a "host" semiconductor technology (e.g., an existing conventional CMOS technology). The PDA tool supports a graphical user interface (GUI) to provide access to the library of photonic pCells to create intuitive physical property layers (also referred to herein as "photonic design layers") for a photonic device, and processes the physical property layers using the DRC violation removal function and the design rules to automatically generate a plurality of mask design layers for a "DRC clean" physical layout of a photonics device.

In sum, one embodiment is directed to an apparatus to facilitate design of semiconductor photonic devices. The apparatus comprises: at least one user interface including at least one display device; at least one processor communicatively coupled to the at least one user interface; and a memory coupled to the at least one processor, the memory having electronically stored therein: a photonics process design library of photonics parameterized cells (pCells); a plurality of processor-executable photonics design functions including a design rule check (DRC) violation removal function; and a semiconductor technology-dependent parameter file including a plurality of design rules that define allowed semiconductor design patterns to be converted to a plurality of semiconductor fabrication mask designs in a first semiconductor technology. Upon execution by the at least one processor of at least some of the processor-executable photonics design functions, the at least one processor: A) controls the at least one user interface and the at least one display device to facilitate electronic access to the library of photonics pCells to create a plurality of physical property layers for a first photonic device; and B) processes the plurality of physical property layers using the DRC violation removal function and at least some of the plurality of design rules in the semiconductor technology-dependent parameter file to automatically generate a plurality of mask design layers for a physical layout of the first photonic device in the first semiconductor technology, such that the plurality of mask design layers substantially avoid DRC violations in the first semiconductor technology.

Another embodiment is directed to a method for computer-facilitated design of semiconductor photonic devices, the method comprising: A) providing a photonics process design library of photonic parameterized cells (pCells) to facilitate design, via a graphical user interface, of a plurality of physical property layers for a first photonic device; and B) electronically processing the plurality of physical property layers using: a design rule check (DRC) violation removal function; and a semiconductor technology-dependent parameter file including a plurality of design rules that define allowed semiconductor design patterns to be converted to a plurality of semiconductor fabrication mask designs in a first semiconductor technology used to make the first photonic device, to automatically generate a plurality of mask design layers for a physical layout of the first photonic device in the first semiconductor technology, such that the plurality of mask design layers substantially avoid DRC violations in the first semiconductor technology.

Another embodiment is directed to a non-transitory computer-readable storage medium encoded with instructions that, when executed by at least one processor, perform a method for computer-facilitated design of semiconductor photonic devices, the method comprising: A) providing a photonics process design library of photonic parameterized cells (pCells) to facilitate design, via a graphical user interface, of a plurality of physical property layers for a first photonic device; and B) electronically processing the plurality of physical property layers using: a design rule check (DRC) violation removal function; and a semiconductor technology-dependent parameter file including a plurality of design rules that define allowed semiconductor design patterns to be converted to a plurality of semiconductor fabrication mask designs in a first semiconductor technology used to make the first photonic device, to automatically generate a plurality of mask design layers for a physical layout of the first photonic device in the first semiconductor technology, such that the plurality of mask design layers substantially avoid DRC violations in the first semiconductor technology.

Another embodiment is directed to an apparatus to facilitate design of zero-change CMOS photonic devices. The apparatus comprises: at least one user interface including at least one display device; at least one processor communicatively coupled to the at least one user interface; and a memory coupled to the at least one processor, the memory having electronically stored therein processor-executable instructions and: a photonics process design library of photonics parameterized cells (pCells); a design rule check (DRC) violation removal function; and a CMOS technology-dependent parameter file including a plurality of design rules for a host CMOS node. Upon execution by the at least one processor of the processor-executable instructions, the at least one processor: A) controls the at least one user interface and the at least one display device to facilitate electronic access to the library of photonics pCells to create a plurality of physical property layers for a first photonic device, wherein at least one physical property layer of the plurality of physical property layers for the first photonic device is created to include at least one curved structure; B) processes the at least one physical property layer including the at least one curved structure to convert the at least one curved structure to at least one orthogonal polygon representing the at least one curved structure in the at least one physical property layer; and C) processes the plurality of physical property layers, including the at least one physical property layer including the at least one orthogonal polygon representing the curved structure, using the DRC violation removal function and at least some of the plurality of design rules in the CMOS technology-dependent parameter file to automatically generate a plurality of mask design layers for a physical layout of the first photonic device in the host CMOS node, such that the plurality of mask design layers substantially avoid DRC violations in the host CMOS node.

Another embodiment is directed to an apparatus to facilitate design of zero-change CMOS photonic devices. The apparatus comprises: at least one user interface including at least one display device; at least one processor communicatively coupled to the at least one user interface; and a memory coupled to the at least one processor, the memory having electronically stored therein processor-executable instructions and: a photonics process design library of photonics parameterized cells (pCells); a design rule check (DRC) violation removal function; and a CMOS technology-dependent parameter file including a plurality of design rules for a host CMOS node, wherein a first design rule of the plurality of design rules specifies a minimum dimension requirement. Upon execution by the at least one processor of the processor-executable instructions, the at least one processor: A) controls the at least one user interface and the at least one display device to facilitate electronic access to the library of photonics pCells to create a plurality of physical property layers for a first photonic device, wherein at least one physical property layer of the plurality of physical property layers for the first photonic device includes at least one orthogonal polygon; and B) processes the plurality of physical property layers, including the at least one physical property layer including the at least one orthogonal polygon, using the DRC violation removal function and at least the first design rule specifying the minimum dimension requirement, to: enlarge and diminish dimensions of the at least one orthogonal polygon to thereby generate at least one transformed orthogonal polygon, wherein all opposite edges of the at least one transformed orthogonal polygon are separated by at least the minimum dimension requirement, and automatically generate a plurality of mask design layers for a physical layout of the first photonic device in the host CMOS node, based at least in part on the at least one transformed orthogonal polygon, such that the plurality of mask design layers substantially avoid DRC violations in the host CMOS node.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 10A is a rendering of an optical modulator design comprising a plurality of polygons, according to some embodiments.

FIG. 10B is a manhattanized version of the modulator design of FIG. 10A.

FIG. 13A shows a rendering of a polygon that violates a design rule, according to some embodiments.

FIG. 13B is a manhattanized/orthogonal version of the polygon of FIG. 13A, according to some embodiments.

FIG. 13C shows a positive sizing operation ("over") being performed on the polygon of FIG. 13B, according to some embodiments.

FIG. 13D shows a negative sizing operation ("under") being performed on the polygon of FIG. 13C, resulting in a DRC-clean design, according to some embodiments.

FIG. 18 is a rendering including a spoke-ring optical modulator photonic pCell and a metal fill pattern, and includes an inset showing the photonic pCell parameter list, according to some embodiments.

DETAILED DESCRIPTION

Figure 1:
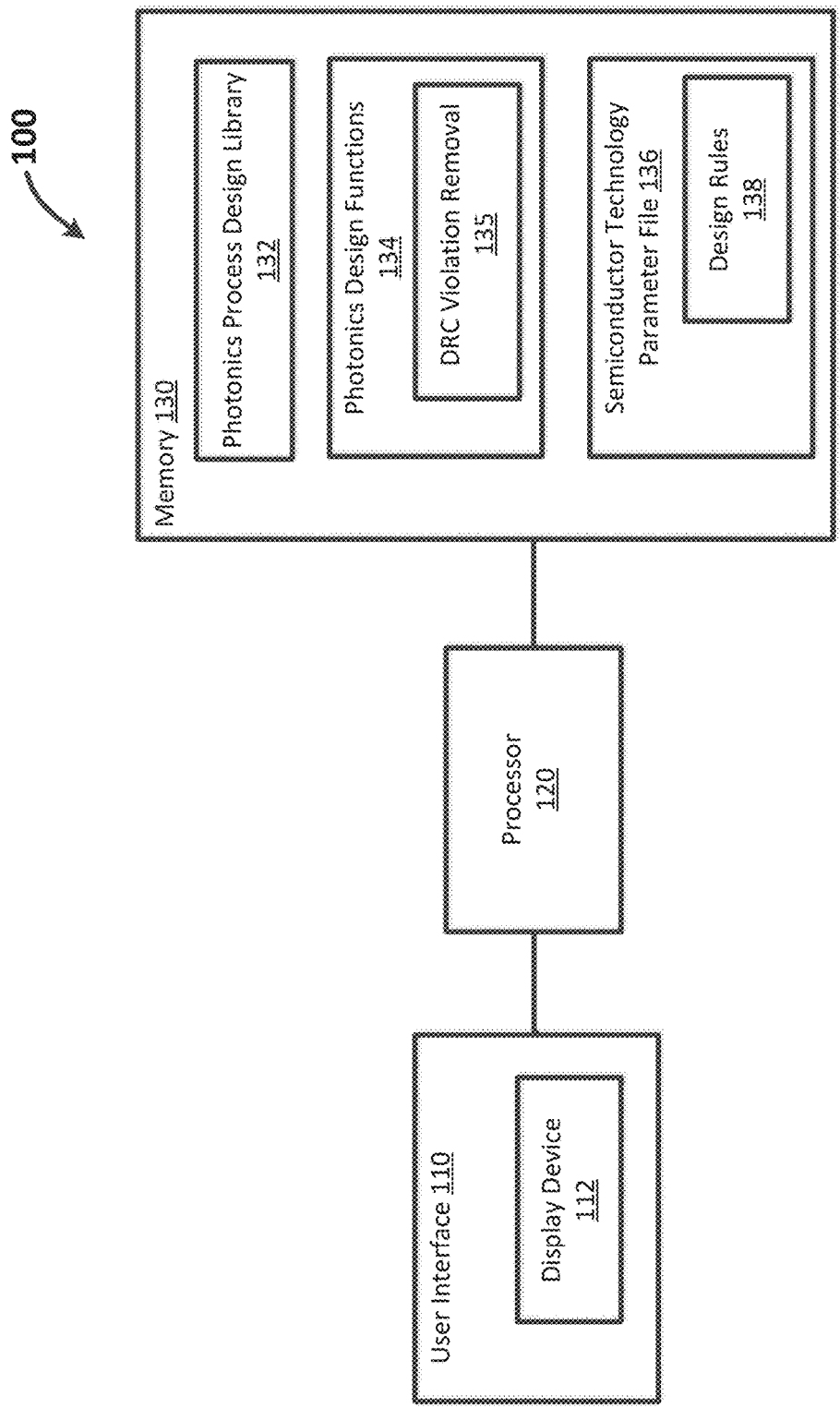
FIG. 1 is a system block diagram of an apparatus according to some embodiments.

Following below are more detailed descriptions of various concepts related to, and embodiments of, inventive methods and apparatus for automated design of semiconductor photonic devices. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Photonics Design Automation (PDA) tools as described herein are based on apparatus and methods according to various embodiments that significantly facilitate design of semiconductor photonic devices and integrated photonic-electronic devices. Examples of PDA tools employ intuitive photonics design layers that are generally agnostic to the semiconductor manufacturing process technology that will be used to ultimately manufacture the photonics devices. These photonics design layers are also referred to as "physical property layers," as they provide a photonics designer with physical property-oriented building blocks that appeal to the designer's working knowledge of photonics, so as to enable a more intuitive approach toward computer-aided photonics design. Designers are therefore able to focus on physical properties (e.g., where to place waveguides, dopants, nitride, silicon germanium (SiGe), etc.) when drawing/designing photonic devices, rather than on semiconductor manufacturing process technology-dependent details. The photonics design layers are then automatically processed to ensure that, in generating mask layers for the actual masks used to manufacture the device(s), designs for a given photonic device substantially avoid, or are free of, design rule violations given the particular semiconductor technology that will be used to manufacture the photonic device(s).

As discussed above, design rules are geometrical constraints on mask designs for ensuring intended functionality and high yields during semiconductor device manufacturing using a particular semiconductor manufacturing process technology. Design rules define permissible design patterns (e.g., comprising one or more features or elements, also referred to as "objects") present in individual or multiple photonic design layers which are subsequently converted into mask designs through a data preparation step referred to as "design rule check" (DRC). In one example, single-layer design rules include minimum dimensions of feature size (e.g., minimum length, width, and/or notch), minimum pattern area, maximum pattern area, minimum element area, maximum element area, minimum spacing between elements/features (e.g., active to active spacing, well to well spacing, metal to metal spacing), and/or permissible orientations of polygon edges. Examples of design rules involving multiple layers include minimum or maximum distance, extension, and overlap between two or more layers. A device design that does not violate any design rules may be referred to as being "DRC clean."

The consequences of violating design rules in a design for a photonic device that will be manufactured in a conventional and well-established semiconductor technology (e.g., a common CMOS technology node) have different severities, depending upon the application. For example, some design rules designed to ensure the correct functionality of transistors are safely waived when dealing with photonic devices. Other violations, however, may affect the performance of the photonic device locally (e.g., when silicide is not surrounded by a sufficient amount of highly-doped silicon, which may lead otherwise to the formation of Schottky diodes). More significant design rule violations, however, may compromise the functionality of the entire wafer serving as a substrate for the devices. Violations involving minimum-size rules are an example: if one or more features defined by a mask layer are too small, the resulting photoresist used to physically define the feature likely will be too narrow, may detach from the wafer during fabrication, and may reach distant locations on the wafer, thereby potentially compromising the functionality of other devices. Similarly, if two metal lines are drawn too close to each other, they may short-circuit. Also, if density requirements are not properly met (e.g., metal fill density, polysilicon density, component density, etc.), chemo-mechanical polishing planarization of the wafer may not result in acceptable thickness uniformity and instead may result in local dishing of the wafer.

In view of the foregoing, the inventive apparatus and methods described herein according to various embodiments contemplate a "design rule check (DCR) violation removal function" to ensure that designs for a given photonic device substantially avoid, or are free of, design rule violations, given the particular semiconductor technology that will be used to manufacture the photonic device. In some embodiments, apparatus and methods also contemplate additional design rules particular to photonic devices to expand the set of design rules typically employed by an electronic design automation (EDA) tool. Some examples of photonics-specific design rules according to various embodiments (discussed further below) include, but are not limited to, minimum metal density requirements around waveguides, size (e.g., width) requirements for a silicon-germanium (SiGe) element in a photonic device (e.g., to prevent structural defects in the SiGe), overlap of SiGe elements with n-type and p-type doped silicon regions (e.g., for formation of diodes in proximity to SiGe regions employed in photodetectors), proximity limitations for optically absorbing materials (e.g., silicide, highly-doped silicon, metals) in the vicinity of optical waveguides, and proximity/spacing rules for adjacent optical devices (e.g., resonator rings, bus waveguides, grating structures, etc.).

For the photonics designer, a process design kit that includes photonics-specific cells and functions, the availability of intuitive physical property design layers, and automatically implementing a design rule check (DCR) violation removal function for the design of a photonic device, provide significant advances in photonics design. With electronic semiconductor devices, conventionally a design rule check is implemented in an EDA tool on a chip-level (i.e., at the end of a design process, when multiple electronic devices are already in place and interconnected). Presently, however, there is no photonics design tool that automatically checks for design rule violations. As a consequence, a photonics designer attempting to design a photonic device would need to fix any DRC violations manually, i.e., via a long series of DRC runs, iterating several manual fixes across an entire chip including one or more photonic devices. This process is very time consuming and significantly limits the number of different cells the photonics designer could design. For large scale integration (e.g., tens to hundreds of optical modulators and detectors all slightly tuned to create wavelength-specific devices for a wavelength-multiplexed communication system), such manual approaches do not scale and make the task of effective photonics design nearly impossible (and certainly far from reliable).

PDA tools based on inventive apparatus and methods according to the present disclosure facilitate not only the intuitive design of photonic devices, but also automatic generation of mask design layouts for photonic devices that substantially avoid, or are free of, design rule violations. In some embodiments, the tool is written in SKILL, the native scripting language of the EDA tool Virtuoso by Cadence®, allowing for seamless integration of photonic and electronic designs in a single design environment. Each library in Cadence® (whether native or created by a designer) contains several "parts" called "cell views" with at least one view associated with it (i.e., a view of a part). For instance, a designer could create a library called "my_digital_parts" with a cell view called "two_to_one_MUX" for a multiplexer. Built-in SKILL functions allow for the manipulation of layouts, shapes, instances and connectivity properties. However, the native SKILL environment (for example, in functions such as dbCreatePolygon and rodCreatePolygon) prohibits defining polygons with more than 4,000 points (constraining some types of designs, such as curved structures or rings, or non-orthogonal shapes such as triangles, to a few micrometers in size), and does not include built-in waveguide-ports functionalities. The former limitation is not an issue when designing transistors, since transistors are typically drawn using rectangles, and can be defined with a relatively small set of points. Photonic components (e.g., comprising rings or having bends), by contrast, have dimensions of a few micrometers at least, leading to polygons that violate SKILL size limitations. Moreover, the concept of waveguide-port has no analog in the electronic world. While the connectivity of two wires requires just a metallic link between them of (almost) any shape and direction, in the context of waveguides, each of port width, location and orientation are taken into account. Ideally, since a typical optical layout includes several instances of individual master cells, the waveguide ports should automatically align and reorient according to the properties of each instance. The limitations of SKILL described above have been overcome using custom algorithms described herein.

Photonic Design Automation (PDA) Tool

FIG. 1 is a system block diagram of an apparatus 100 for implementing a photonic design automation (PDA) tool, according to some embodiments. The apparatus 100 comprises at least one user interface 110, including at least one display device 112 (e.g., an electronic display, a graphical user interface, etc.), and at least one processor 120 communicatively coupled to the at least one user interface 110. A memory 130 is operably coupled to the processor 120 and stores a photonics process design library 132 including photonics parameterized cells (pCells), a plurality of processor-executable photonics design functions 134 (e.g., including a design rule check (DRC) violation removal function, an automated waveguide generation function, an automated waveguide port alignment function, any of the procedures shown in FIG. 7, etc.), and a semiconductor technology-dependent parameter file 136. In some embodiments, the photonics design functions 134 comprise procedures or scripts that become executable after being interpreted by a compiler.

In one exemplary implementation, the photonics process design library 132 of photonics pCells, the plurality of processor-executable photonics design functions 134, and/or the semiconductor technology-dependent parameter file 136 may be written in the scripting language SKILL used in the Virtuoso EDA tool by Cadence®. While not shown explicitly in FIG. 1, the memory 130 may also include, electronically stored therein, a plurality of computer-executable instructions to implement the Virtuoso EDA tool by Cadence®. In one example, the photonics process design library 132 is accessible by a photonics designer via the user interface 110, and elements of the process design library 132 are incorporated by the user into a design for a photonic device via one or more photonics design layers, which may be combined with one or more other electronics design layers (e.g., layers that are native to the given EDA environment) to form a composite photonic-electronic design, as described more fully below.

As noted above, the processor-executable photonics design functions 134 include a design rule check (DRC) violation removal function 135. The semiconductor technology-dependent parameter file 136 (also referred to herein as a "Global Variables" file) includes a plurality of design rules 138 that define allowed semiconductor design patterns to be converted to a plurality of semiconductor fabrication mask designs in a first (or "host") semiconductor technology that will be used to manufacture the designed photonic device. Each said semiconductor technology-dependent parameter file 136 corresponds to a particular semiconductor technology, examples of which include, but are not limited to, IBM 32 nm 13SOI, IBM 45 nm 12SOI, IBM SOI12SO 32 nm, modified IBM 10LPE, Texas Instruments 65 nm bulk CMOS, and/or any CMOS technology with sufficiently thick silicon for guiding light and a way to sufficiently isolate the optical mode. Semiconductor technology-dependent parameter files 136 include design-related data that are specific to those technologies (e.g., relating to a 45 nm node versus a 32 nm node).

Upon execution by the processor 120 of at least some of the processor-executable photonics design functions 134, the processor 120 controls the user interface 110 and the display device 112 to facilitate electronic access to the photonics process design library 132, for example to create a plurality of physical property layers (also referred to herein as "abstract layers" or "photonic design layers") for a first photonic device (e.g., including a first waveguide port). Optionally, via access to the process design library, additional physical property layers may be created for at least one further photonic device (e.g., a second photonic device including a second waveguide port) and, optionally, at least one interconnection between the first photonics device and the at least one further photonics device. The processor 120 then processes the plurality of physical property layers using the DRC violation removal function 135 and at least some of the plurality of design rules 138 in the semiconductor technology-dependent parameter file 136 to automatically generate a plurality of mask design layers for a physical layout of the first photonic device (and, optionally, the at least one second photonic device, and, optionally, the at least one interconnection between the first photonic device and the at least one further photonic device) in the first semiconductor technology, such that the plurality of mask design layers substantially avoid, or do not include any, DRC violations in the first semiconductor technology.

In some embodiments, the processor 120 may also process the plurality of physical property layers using the automated waveguide generation function and/or the automated waveguide port alignment function to automatically define a waveguide between the first waveguide port and the second waveguide port. The first semiconductor technology may be a 45 nanometer CMOS silicon-on-insulator process technology. The first photonics device and/or the at least one further photonics device may be a "zero-change" CMOS photonics device. In other words, the first photonic device may be designed in an existing EDA environment without making disruptive changes to the process flow (i.e., in the actual fabrication steps in the foundry), and without violating critical design rules.

For purposes of the present disclosure, the term "manhattanize" refers to a process that converts an arbitrary shape (e.g., a non-orthogonal polygon having some number of vertices corresponding to "points" or coordinate pairs in a grid system) to an orthogonal polygon. The resulting orthogonal polygon may have orthogonal segments of arbitrary lengths, or the orthogonal segments may have respective lengths that are a multiple of a base quantity (e.g., 1 nm). Additionally, the orthogonal segments of the orthogonal polygon may be "snapped" to a grid having a particular pitch (e.g., 1 nm). In one aspect, the orthogonal polygon is unique (e.g., it does not depend of any order of the coordinates of the starting non-orthogonal polygon/arbitrary shape), is represented by its own set of coordinates, and constitutes a larger "best-fit" transformation of the starting non-orthogonal polygon/arbitrary shape.

In one example, explained more fully below, a first design rule of the plurality of design rules 138 included in the semiconductor technology-dependent parameter file 136 specifies a minimum space requirement for the plurality of physical property layers (e.g., including at least one polygon). For example, the minimum space requirement can be represented by a parameter 2d. In some such embodiments, the processor 120 processes the plurality of physical property layers using the DRC violation removal function 135 and at least the first design rule of the at least some of the plurality of design rules 138 in the semiconductor technology-dependent parameter file 136 to: (1) manhattanize the at least one polygon so as to re-form the at least one polygon as a plurality of orthogonal segments on a grid having a first pitch (e.g., 1 nanometer); (2) reduce a size of the at least one polygon by a factor "d"; and, subsequently, (3) increase the size of the at least one polygon by a factor "d," such that all opposite edges of the at least one polygon are separated by at least the minimum space requirement represented by the parameter "2d." The at least one polygon, prior to the DRC violation removal function 135, may be defined by more than 4,000 points.

In another example, explained more fully below, the processor 120 processes the plurality of physical property layers using the DRC violation removal function 135 and at least the first design rule of the at least some of the plurality of design rules 138 in the semiconductor technology-dependent parameter file 136 to: (1) tile the at least one polygon (e.g., defined by more than 4,000 points) into a plurality of sub-polygons, wherein each sub-polygon of the plurality of sub-polygons is defined by fewer than 4,000 points; and (2) for each sub-polygon of the plurality of sub-polygons: (2a) manhattanize the sub-polygon so as to reform the sub-polygon as a plurality of orthogonal segments on a grid having a first pitch (e.g., 1 nanometer); (2b) reduce a size of the sub-polygon by a factor d; and, subsequently, (2c) increase the size of the sub-polygon by a factor d, such that all opposite edges of the sub-polygon are separated by at least the minimum space requirement represented by the parameter 2d. In some embodiments, (2c) is performed before (2b).

Generating Photonic Device Designs

Figure 2:
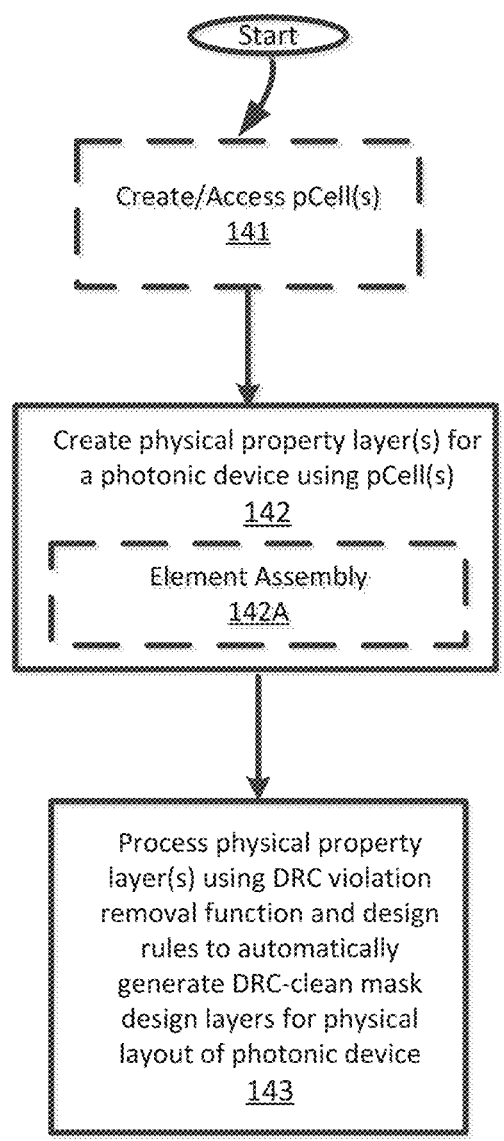
FIG. 2 is a flow chart illustrating a method for computer-facilitated design of semiconductor photonic devices, according to some embodiments.

FIG. 2 is a flow chart illustrating a method for computer-facilitated design of semiconductor photonic devices using the apparatus of FIG. 1, according to some embodiments. In block 141, one or more pCells are created and/or accessed. For example, access is provided to the photonics process design library 132 to allow a designer to obtain one or more photonics pCells germane to the design of a photonic device. Alternatively or in addition, the designer creates a custom photonics element (i.e., for which a predefined pCell does not yet exist) in a physical property layer, the custom photonics element comprising a plurality of coordinates that define a polygon. A new pCell is then generated from the custom photonics element drawn by the designer, as discussed more fully below with reference to FIG. 5, as well as in the section titled "pCell Generation." In block 142, the designer creates one or more physical property layers for a first photonics device based at least in part on one or more photonics pCells, which may be obtained at block 141 and/or created by the designer. As part of the creation of one or more physical property layers 142, a designer may specify that one or more elements thereof be assembled or connected together (in element assembly block 142A, discussed in greater detail below with reference to FIG. 6). In block 143, the one or more physical property layers created in block 142 are electronically processed using: (1) the design rule check (DRC) violation removal function 135 to remove DRC violations from the physical property layer(s); and (2) the semiconductor technology-dependent parameter file 136 including the plurality of design rules 138 that define allowed semiconductor design patterns to be converted to a plurality of semiconductor fabrication mask designs in a first semiconductor technology. A plurality of mask design layers for a physical layout of the first photonics device in the first semiconductor technology is thereby automatically generated, such that the plurality of mask design layers substantially avoid, or do not include, DRC violations in the first semiconductor technology.

As discussed in greater detail below, the physical property layers created by the designer may include a variety of elements having arbitrary shapes as constituents of the photonic device being designed. Examples of such elements include, but are not limited to, silicon-germanium (SiGe) elements, curved structures, ring structures, polygons of various shapes and sizes (including polygons defined by more than 4,000 points or vertices), and waveguide ports.

As also discussed in greater detail below, the processing of physical property layers based on design rules generally is approached in terms of "avoidance" and "removal." Regarding "avoidance," some design rules are implemented automatically based on a description encoded in the semiconductor technology-dependent parameter file (also referred to as "global variables"; see FIG. 4, discussed below). Examples of such design rules include, but are not limited to, minimum distance between vias, maximum or minimum via dimensions, distance of vias from outer borders, and maximum/minimum area of metal shapes. Regarding "removal," the physical property layers may be processed to remove other types of DRC violations during a "data preparation step" (see FIGS. 3-4, discussed below). In particular, at least three types of operations can be executed during data preparation: 1) sizing all shapes on any given layer (e.g., a physical property layer) by an amount "d," followed by sizing them by the opposite quantity ("-d"). This operation is called "under-of-over" and removes, for example, minimum gaps between shape features by filling them; 2) sizing all shapes on any given layer (e.g., a physical property layer) by an amount "-d," followed by sizing them by the opposite quantity ("d"). This operation is called "over-of-under" and removes minimum feature size violations; and 3) the extension of one layer (e.g., a first physical property layer) over another layer (e.g., a second physical property layer). More detail on the foregoing concepts is provided in the section titled "Sizing," below.

Abstract/Physical Property Layer Design

When creating designs for devices, circuits and entire chips for CMOS nodes, electronics designers traditionally do not need to design from scratch novel transistors or pCells. Indeed, an extensive library is often provided by the CMOS manufacturer together with full descriptions of the electrical characteristics, critical physical dimensions for elements, and schematic representations, all of which may be contained in the process design kit (PDK). If the designer desires more advanced cells, there may be an option of accessing specialized libraries, which, under a license agreement, extend the designers capabilities. In rare cases, however, when such options remain insufficient, the designer is forced to create his own transistors, but this task is facilitated by the structure that manufacturers give to the design layers. For example, for defining the body of an nFET, it is sufficient to draw an n-well layer so that in a fab-internal post-processing step, a number of layers, such as stressors, halo and extension implants, block levels for some p-type implants, are automatically generated. In other words, the task of the low-level electronics designer is facilitated by the structure of the design layers he can access. Moreover, mistakes are minimized, and proprietary process information can be conveniently hidden.

The framework described immediately above, however, constitutes a challenge when designing photonic components in advanced microelectronics CMOS nodes. As an example, while all electronic devices require either n-type or p-type implants, photonic devices usually require undoped silicon to avoid optical losses caused by free-carrier absorption. However, according to the process-flow of some electronics CMOS foundries, every time that a structure is not defined as n-well, it will automatically be doped p-type unless special design layers are accessed. Hence, although CMOS nodes have evolved over decades for improving and facilitating electronic design, photonic structures have not been taken into account during this development. As a consequence, design of photonics not only did not benefit from the methods developed, but has been made much more cumbersome by these very design flows for electronics. More specifically, the photonics designer would like to draw shapes on the individual masks used in the actual fabrication process—for example, to specify the location of crystalline silicon, stressors, ion-implants, poly-silicon, and so forth. However the so-called 'mask layers' usually cannot be accessed directly. Instead, the designer is expected to draw shapes on 'design layers' (such as the n-well described above) or on 'utility layers.' Utility layers are used, for example, to specify that certain locations are meant to be of a certain type (e.g., memory instead of logic cells)—and this has consequences for the fabrication process. The photonics designer, therefore, is often forced to draw many layers just to define one particular feature, such as low optical-loss crystalline silicon.

As part of the PDA tools described herein, a pre-existing PDK (e.g., of a CMOS foundry and accessible, for example, via SKILL) is modified through the addition of novel photonics design layers (also referred to herein as "physical property layers") that are technology-independent and have an intuitive meaning for photonics designers. Photonics design layers can include, by way of non-limiting example, crystalline silicon, undoped crystalline silicon, polysilicon, undoped polysilicon, silicide, oxide, n-well implant, a solitary n-well implant, undoped silicon germanium, a p-well, and/or the like. In one implementation some of these photonic layers are called, for example, "rx1phot" (crystalline silicon), "pc2phot" (polysilicon), "pc3phot" (undoped polysilicon), sldphot ("silicide"), "nw1phot" (n-well implant), "nw2phot" (a solitary n-well implant), "sigephot" (undoped silicon germanium), "pw4phot" (p-well), etc.

An exemplary listing of photonic design layers according to one embodiment of the present disclosure, e.g., for addition to a PDK, is as follows:

| | |
|---|---|
| ☒ rxphot | drw |
| ☒ pc1phot | drw |
| ☒ pc2phot | drw |
| ☒ sldphot | drw |
| ☒ nw1phot | drw |
| ☒ nw2phot | drw |
| ☒ nw3phot | drw |
| ☒ nw4phot | drw |

| | |
|---|---|
| ☒ pw1phot | drw |
| ☒ pw2phot | drw |
| ☒ pw3phot | drw |
| ▨ pw4phot | drw |
| ☐ nh1phot | drw |
| ☐ nh2phot | drw |
| ☐ ph1phot | drw |
| ☐ ph2phot | drw |
| ☒ nnphot | drw |
| ☒ ppphot | drw |
| ☒ smphot | drw |
| ▨ tjphot | drw |
| ☒ ox1phot | drw |
| ☒ ox2phot | drw |

In some embodiments, these layers have a photomask tone (i.e., positive or negative) that more naturally corresponds to the intuition of the designer than in traditional EDA layers. In the case of doping, for example, a designer draws shapes corresponding to the locations that should be implanted, instead of corresponding to the locations which should not receive the implants. The translation into final, technology-dependent design and utility layers happens during an automated data preparation step described more fully below (see, e.g., FIG. 4).

Figure 3:
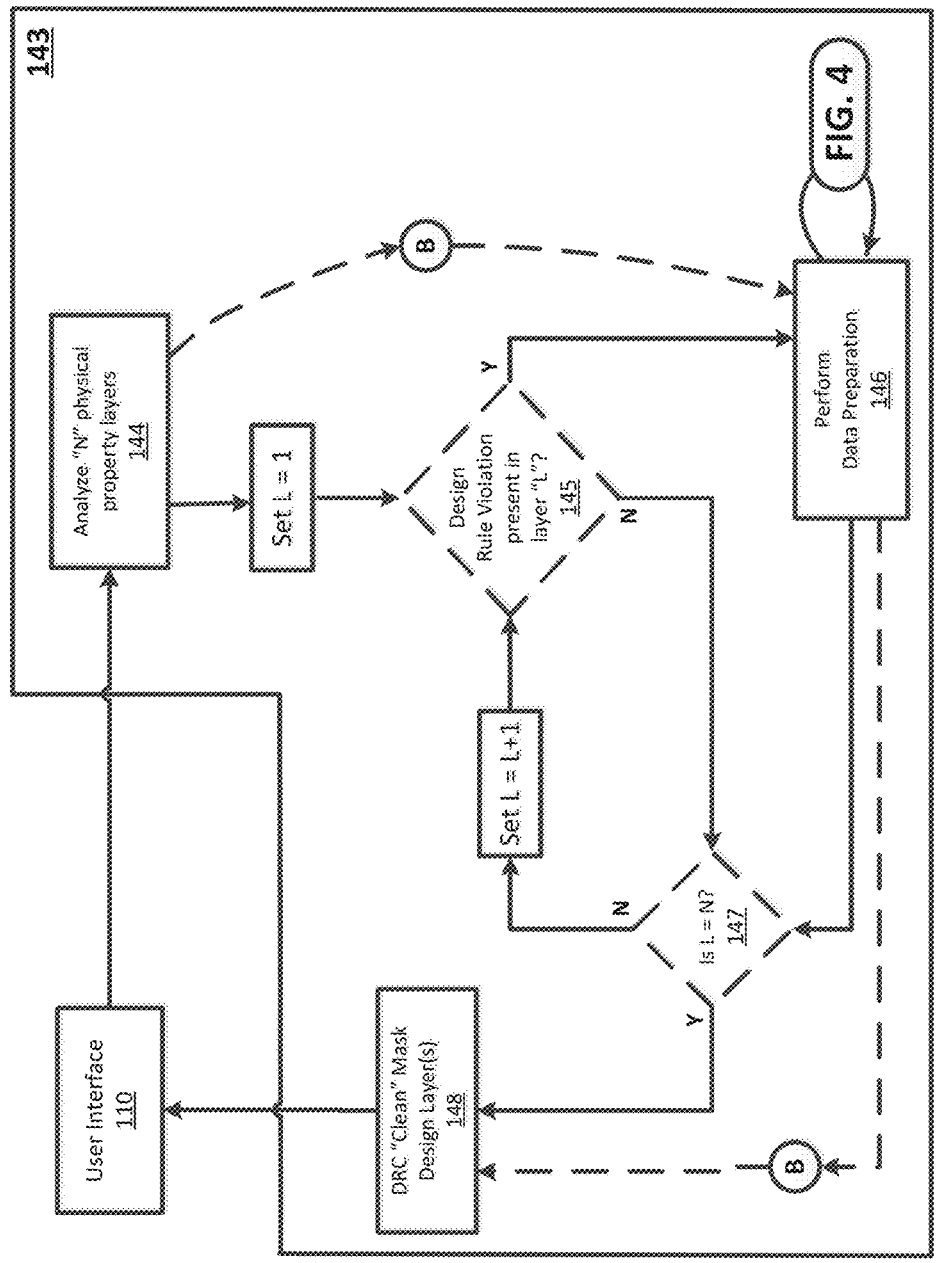
FIG. 3 is a flow chart illustrating additional details of the method of FIG. 2, according to some embodiments.

FIG. 3 is a flow chart illustrating additional details of the method shown in FIG. 2 and, in particular, further details of the block 143 regarding the processing of physical property layers (photonics design layers). For example, in block 144 of FIG. 3, each physical property layer (e.g., of "N" total physical property layers received via user interface 110) is analyzed in turn vis a vis the design rules for the semiconductor technology that will be used for manufacturing. In block 145, the method determines whether or not a design rule check (DRC) violation is present in a given physical property layer (specifically, a first layer "L," initially set to a value of 1). If there is no design rule violation in the physical property layer being analyzed, the method proceeds to block 147 to determine if there are additional physical property layers to be analyzed (i.e., if L<N). If, on the other hand, a DRC violation is present, then the method proceeds to block 146 to perform a data preparation procedure to remove the DRC violation from the physical property layer (further details of the data preparation procedure are provided in connection with FIG. 4). The method then proceeds to block 147 to determine if there are additional physical property layers to be analyzed. If additional physical property layers are to be analyzed, then the value of "L" is incremented by 1 (set L=L+1) and the method again determines whether or not a design rule check (DRC) violation is present in a given physical property layer (at block 145) as described above, looping back to blocks 146 and/or 147, as appropriate. Once all physical property layers have been similarly analyzed, in block 148 the method generates a plurality of DRC-clean mask design layers for the physical layout of the photonic device.

In other embodiments, the method does not perform step 145, and instead proceeds (along path "B") to perform data preparation procedure 146 to remove any DRC violations from each of the N physical property layers, and in block 148, generating a plurality of DRC-clean mask design layers for the physical layout of the photonic device.

Data Preparation Overview

Figure 4:
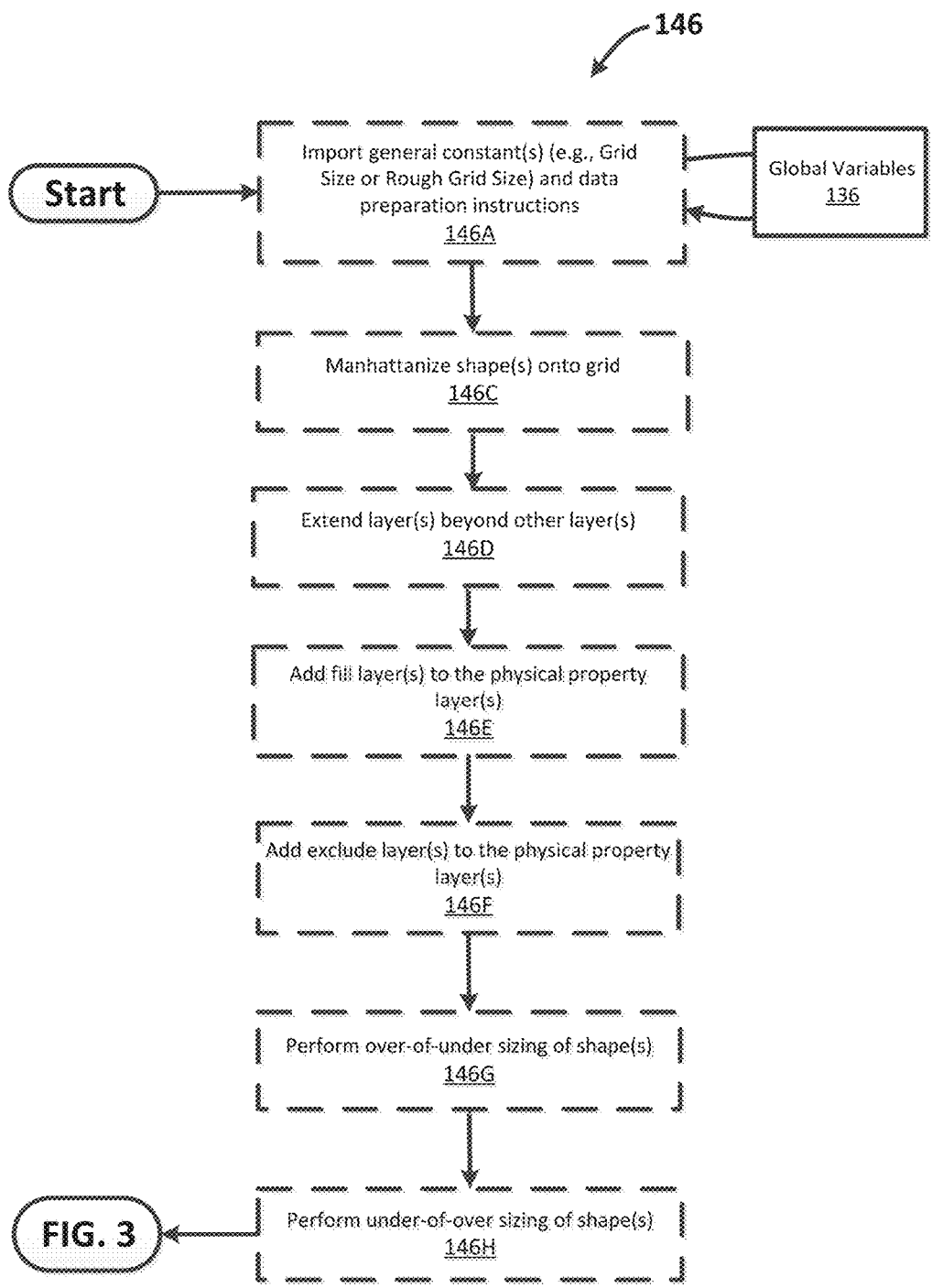
FIG. 4 is a flow chart providing an overview of the data preparation procedure of FIG. 3, according to some embodiments.

FIG. 4 is a flow chart providing an overview of the data preparation procedure block 146 of FIG. 3, according to some embodiments. An exemplary data preparation procedure is shown in FIG. 4, in which one or more of the following is performed: importing general constant(s), such as grid size or rough grid size, as well as data preparation instructions, from a global variables file 136 (which is a semiconductor technology-specific parameter file, as discussed with reference to FIG. 1 above) at block 146A; converting one or more shapes of the physical property layer(s) into a plurality of respective orthogonal segments, for example on a manhattan grid (referred to herein as "manhattanization") at block 146C having a grid size as may have been defined by global variables 136 at block 146A; extending one or more of the physical property layers beyond one or more other physical property layers at block 146D; adding one or more fill layers to the physical property layer(s) at block 146E; adding one or more exclude layers to the physical property layer(s) at block 146F; performing an over-of-under sizing operation of one or more shapes of the physical property layer(s) at block 146G; and/or performing an under-of-over sizing operation of the one or more shapes of the physical property layer(s) at block 146H.

In one example, the global variables file 136 includes semiconductor technology-specific constants such as grid size, rough grid size, via names, metal layer names, minimum and/or maximum feature sizes for one or more of the mask layers, minimum and/or maximum area for one or more layers, via pitch dimensions, tiling pitch for density rules, minimum and/or maximum density percentages, and/or or the like. In some such examples, the global variables file 136 also includes one or more commands, such as those described in blocks 146C-146H.

A table of primary mask layer definitions in Cadence® is provided below, followed by an example of a set of data preparation commands.

| Layer Abbreviation | Layer Name | Color | Primary Function |
|---|---|---|---|
| M1 | Metal 1 | Blue | First level of metal used for device interconnection |
| PC | Poly | Red | Forms transistor gate when crossing diffusion; short interconnect |
| RX | Diffusion | Green | Defines active areas for transistor formation as well as substrate and well contacts |
| CA | Contact | Yellow | Defines oxide cut for M1 connections to RX or PC |
| NW | N-Well | Yellow | Pfet devices will reside in n-well |
| BP | P+ Implant | Brown | Defines p+ regions for pfets and substrate contacts |
| V1 | Via | Yellow | Defines oxide cut for M2 connections to M1 |
| M2 | Metal 2 | Magenta | Second level of metal used for further connections |

```
;***********************************************************************************************
;***********************************************************************************************
;****                                                                                        ****
;****                              DATAPREP SECTION                                          ****
;****                                                                                        ****
;***********************************************************************************************
;***********************************************************************************************
;
;  The operations below are performed in order of appearance.
;  The syntax is always:
;  list( LppIn1 LppIn2 ... LppInN)
;         list( list(LppOut1 LppOut2 ... LppOutM) OperationAcronym SizeAmount ).
;  Lpp stays for "layer-purpose-pair" as in Cadence language.
;  Acronyms supported are:
;     "Rad"(rough add):   A rough grid speeds up significantly the size operation (for large SizeAmounts)
;                         Every shape on LppIn is manhattanized on the RoughGridSize, sized by SizeAmount and added to LppOut.
;     "Add" (add):        Every shape on LppIn is sized by SizeAmount and added to LppOut.
;     "Sub" (substract):  Every shape on LppIn is sized by Sizeamount and subtracted from LppOut.
;     "Ext" (extend):     Every shape on LppIn is extended by SizeAmount over the shapes on LppOut.
;     "Ouo" (over of under of under of over):  Every shape on LppIn undergoes said operation for DRC-cleaning.
;                         SizeAmounts are loaded by the MinSize and MinSpace rules defined above.
;     "Del" (delete):     Every shape on LppIn is deleted.
;  DataPrep performs loops on every LppIn, and then on every LppOut.
;  Amounts used for sizing globalDataPrepSizeLppsIn into GlobalDataPrepSizeLppsOut
        GlobalDataPrepSizeAmount = 2.0
GlobalDataPrepGroups =
list(
    list(
        list(       list("rx1phot"       "drawing")
                    list("pc1phot"       "drawing")
                    list("pc2phot"       "drawing")
        ); end of LppIn list
        list(       (list( "rx"          "drawing")         "Rad"       GlobalDataPrepSizeAmount)
                    list(  "pc"          "exclude")         "Rad"       GlobalDataPrepSizeAmount)
                    list(  "m1"          "exclude")         "Rad"       GlobalDataPrepSizeAmount)
                    list(  "m2"          "exclude")         "Rad"       GlobalDataPrepSizeAmount)
                    list(  "m3"          "exclude")         "Rad"       GlobalDataPrepSizeAmount)
                    list(  "s1"          "drawing")         "Rad"       GlobalDataPrepSizeAmount) ; silicide block
                    list(  "ndop1"       "drawing")         "Rad"       GlobalDataPrepSizeAmount) ; implant block
        ); end of similar operations group
    ); end of LppOut and action list
    list(
        list(       list("rx1phot" "drawing")
        ); end of LppInn list
        list(       list(           list( "rx"             "drawing") "Add" 0.0)
        ); end of LppOut and action list
        ); end of similar operations group
    list(
        list(       list("pc1phot"       "drawing")
                    list("pc2phot"       "drawing")
        ); end of LppIn list
        list(       list(           list( "pc"             "drawing") "Add" 0.0)
        ); end of LppOut and action list
    ); end of similar operations group
```

-continued

```
); end of similar operations group
list(
    list(       list("pc2phot")         "drawing")
    )end LppIn list
    list(       list(       list( "pczpc"       "drawing") "Add" globalDataPrepSizeAmount)
    ); end of LppOut and action list
); end of similar operations group
list(
    list(       list("sldphot")         "drawing")
    ); end LppIn list
    list(       list(       list( "s1"          "drawing") "Sub" 0.0)
    ); end LppOut and action list
)end of similar operations group
list(
    list(       list("nw1phot")         "drawing")
    )end LppIn list
    list(       list(       list("ndop1"        "drawing") "Sub" 0.0)
    )end LppOut and action list
)end of similar operations group
list(
    list(       list("nw2phot")         "drawing")
    )end of LppIn list
    list(       list(       list("ndop2"        "drawing") "Add" 0.0)
    )end LppOut and action list
)end of similar operations group
list(
    list(       list("pw1phot")         "drawing")
    )end of LppIn list
    list(       list(       list( "pdop1"       "drawing") "Add" 0.0)
    )end of LppOut and action list
)end of similar operations group
```

-continued

```
; *** List of layers to be extended by Ext
    list(
        list(        list("m1"            "drawing")
        )end of LppIn list
        list(        list(        list("v1"    "drawing") "Ext" 0.050)
        ); end of LppOut and action list
    );end of similar operations group
    list(
        list(        list("m2"            "drawing")
        )end of LppIn list
        list(        list(        list("v2"    "drawing") "Ext"0.050)
        ); end of LppOut and action list
    ) ;end of similar-operations group.
; *** List of layers to be DRC-cleaned by OuO (Over of Under of Under of Over)
    list(
        list(        list("rx"            "drawing")
                     list("ndop1"         "drawing")
                     list("ndop2"         "drawing")
                     list("pczpc"         "drawing")
                     list("pc"            "drawing")
                     list("s1"            "drawing")
                     list("pdop1"         "drawing")
                     list("m1"            "drawing")
                     list("m2"            "drawing")
                     list("m3"            "drawing")
        )
        list(        list( nil        "Ouo"       nil); LppOut and SizeAmount are set to nil for "Ouo" operation
        ); end of LppOut and action list
    ) ;end of similar-operations group.
) ; end of GlobalDataPrepGroups.
; *** List of layers to be deleted by Del
    list(
        list(        list("rx1phot"       "drawing")
                     list("pc1phot"       "drawing")
        )
        list(        list( nil        "Del"       nil); LppOut and SizeAmount are set to nil for "Del" operation
        ); end of LppOut and action list
    ) ;end of similar-operations group.
) ; end of GlobalDataPrepGroups.
```

"Exclude" and "drawing" are layer types. The arguments, such as:

("rx1phot" "drawing"), are layer purpose pairs ("Lpp") (i.e., specifying layer "rx1phot" and purpose "drawing"). Each "list" sets forth

---

```
; This pCell creates a Ring as difference of two circles.
; Input arguments:
; ROut: outer radius
; WgWidth: waveguide width (width of the ring)
; Lpp: layer purpose pair, e.g. list ( "rxphot"              "drawing")
;         load(strcat(env(PCELLSKILL) "/1Ring.il"))
pcDefinePCell(
    list( ddGetObj(strcat(env(PROJECT_NAME) "_" env(USER))) "1Ring" "layout")
    ; parameters and their optional defaults;
    (
        (ROut              2.0)
        (RingWidth         0.300)
        (Lpp               list( "pclphot"             "drawing"))
        (ManhattanTOrNil   GlobalManhattanTOrNil)
        (ManhGridSize      GlobalGridSize)
    ) ;end of parameter list
```

--- which layers are translated into which other layers, as explained in the header comments above.

pCell Generation

While the discussion thus far contemplates that a photonics designer has a library of previously-defined photonics pCells (e.g., FIG. 1, photonics process design library 132) to use to create one or more physical property layers for the design of a photonic device, in other embodiments the designer also may create/define new photonics pCells that may be included in the photonics design library and used to design a photonic device.

Figure 5:
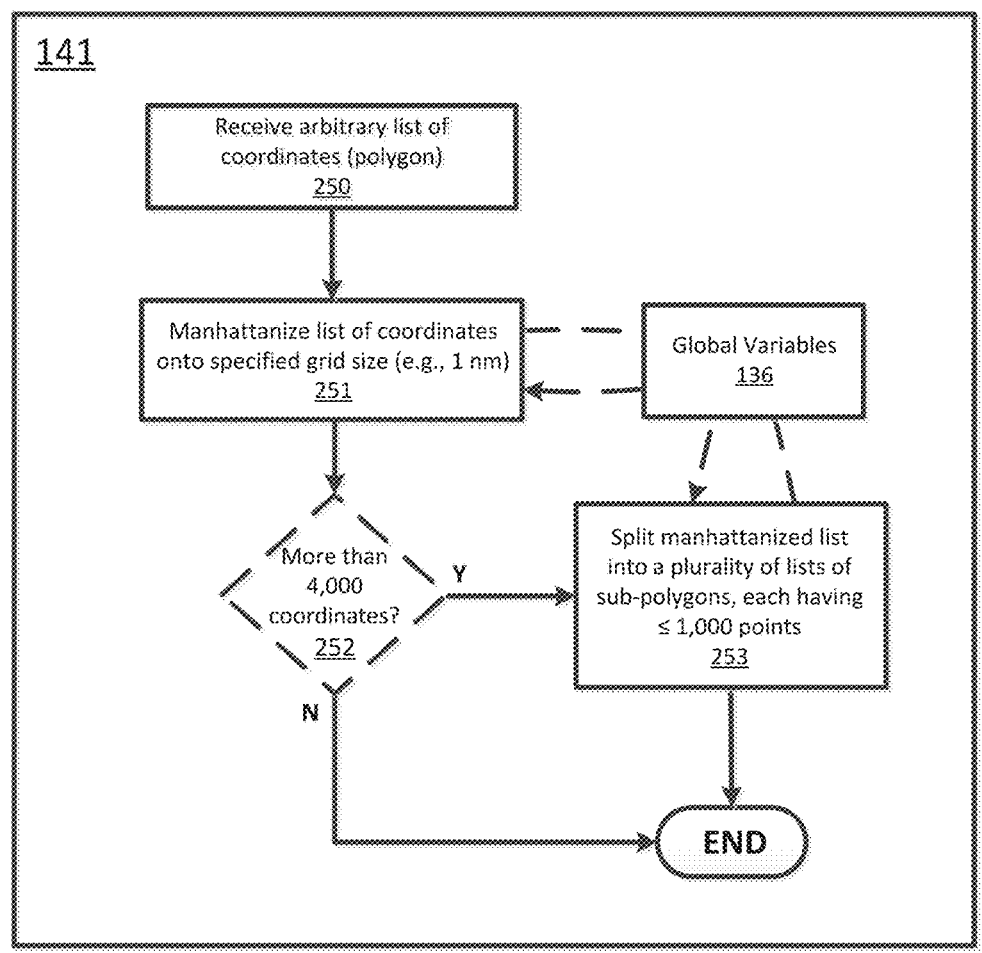
FIG. 5 is a flow chart showing additional details of the method of FIG. 2, according to some embodiments.

In one example, a designer draws a custom photonics element (i.e., for which a predefined pCell does not yet exist) in a photonics layer, the custom photonics element comprising a plurality of coordinates that define a polygon. FIG. 5 is a flow chart showing additional details of the method of FIG. 2, according to some embodiments. Specifically, the flow chart of FIG. 5 shows an example implementation of block 141 of FIG. 2 in which the designer creates a new photonics element/device (for a new pCell). In one example, the designer draws the photonics element/device on a physical property layer via user interface 110, which may include a grid or other type of coordinate space such that the element/device, once drawn, comprises an arbitrary list of coordinates. In another example, the designer enters an arbitrary list of coordinate, corresponding to a desired polygon, via the user interface 110. At block 250, the arbitrary list of coordinates that define a polygon is received. A manhattanization procedure (block 251) is then performed, by which the lists of coordinates are orthogonalized onto a specified grid size, such as 1 nm. The grid size can be specified in, and imported from, for example, global variables 136. If the manhattanized list of coordinates includes more than 4,000 coordinates (block 252), a plurality of sub-polygons, which together define the intended polygon, are created (e.g., in Cadence®) at block 253. In other words, upon receipt of the manhattanized list of coordinates at block 253, the method subdivides the polygon into a plurality of sub-polygons, each comprising its own corresponding list of 1,000 or fewer coordinates. Other maximum quantities of coordinate points for sub-polygons are also contemplated, such as 1,500, 2,000, 2,500, 3,000, 3,500, and less than 4,000. In some embodiments, the manhattanizing 251 uses a smaller grid size (e.g., 1 nm) than the manhattanizing of FIG. 4 (at 146C, e.g., using a grid size of 10 nm).

An example of a pCell header (specifying the parameters of the pCell) for a ring that is defined as a difference between two circles is as follows:

The "ROut" parameter specifies an outer radius, "RingWidth" specifies the outer radius minus an inner radius, "Lpp" is a "layer purpose pair," where "pclphot" is the layer name and "drawing" is the type of layer. "ManhattanTOrNil" is set to either true or Nil, to produce a manhattanized shape or not, respectively. "ManhGridSize" specifies the step size of the manhattan grid.

In some embodiments, after execution of a pCell, a formatted list (or "array") with the coordinates and orientation, dimension, layer and name of all input/output optical/electrical ports (and their level) is returned so that the designer knows where to place electrical wires/connections and/or where to place connecting waveguides.

In some embodiments, a programmer places a list of devices into a design by specifying their coordinates in a file (e.g., an ".lef" file), and a topology (i.e., how ports of different devices are connected together) is written by the programmer (e.g., in a Verilog file). The different devices are then connected together automatically via one or more procedures set forth herein.

Automatic Port Connection

Figure 6:
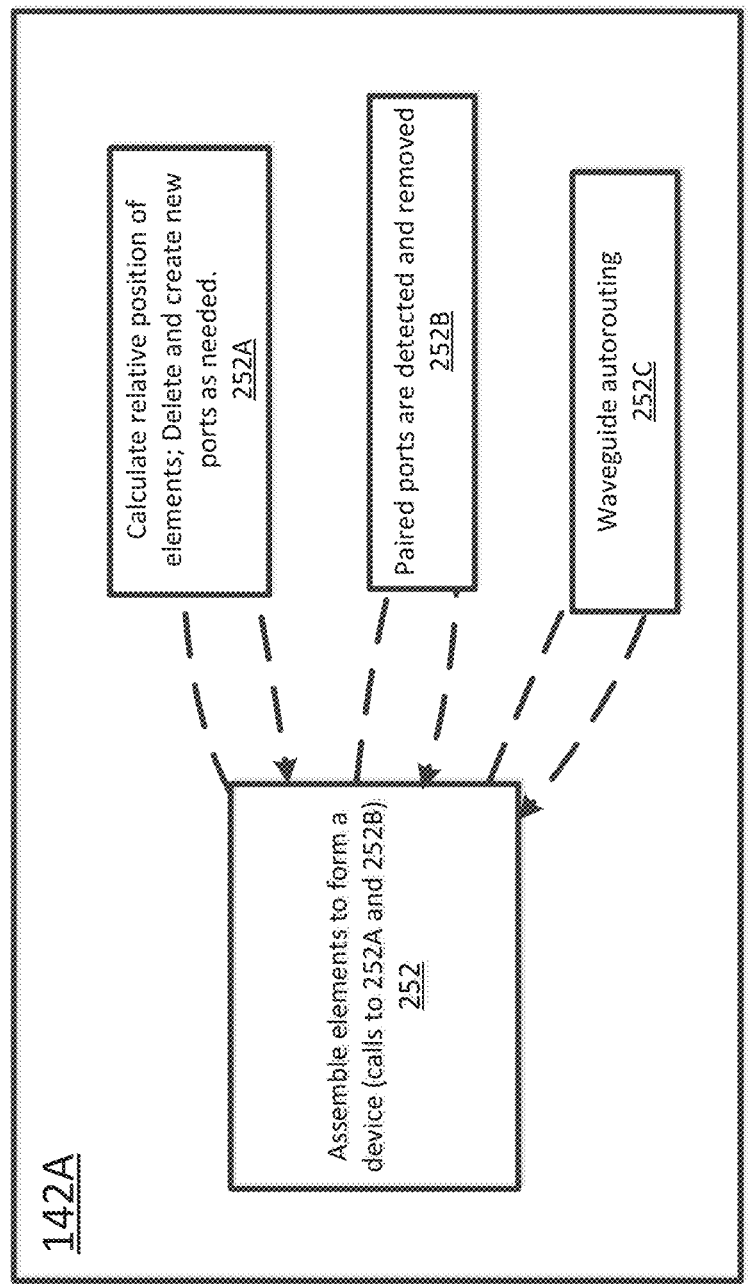
FIG. 6 is a flow chart illustrating details of an automatic port connection procedure, according to some embodiments.

During the creation of a physical property layer, multiple elements (e.g., including an element whose pCell is defined by the process of FIG. 5 and/or by the photonics process design library of FIG. 1) may be assembled together so as to form one or more connected photonic devices (e.g., a modulator) or systems. For example, a designer may specify, e.g., via a script, one or more ports within the physical property layer to be connected to one another prior to data preparation. FIG. 6 is a flow chart illustrating details of the element assembly 142A of FIG. 2, according to some embodiments. In one example, when elements (e.g., shapes) of a physical property layer are assembled at block 252 (e.g., by express instruction of a designer), a call is made to block 252A. Block 252A determines relative positions of elements/shapes of the physical property layer and creates and/or deletes ports to connect the elements of the physical property layer. Additionally or alternatively, at block 252B, an identity of a port pair (i.e., ports that are facing, near to and/or adjacent to one another, for example corresponding to a first waveguide and a second waveguide of the physical property layer) is received, and ports of the port pair are automatically joined based on the identity of the port pair. Additionally or alternatively, at block 252B, a first identifier of an input port and a second identifier of an output port of the physical property layer are received, and a waveguide is autorouted between the input port and the output port based on the first identifier and the second identifier. In some examples, the automatic port connection procedure also includes procedures to change the name of a port, to delete a port, or to determine which cell view a port belongs to. The numbering of ports (e.g., Port1, Port2, etc.) may be recreated, for example, so as to avoid doubles or jumps (in other words, to avoid the using the same port number twice for two different ports, or to skip a port number in a sequence of port numbers, respectively).

Photonics Process Design Library Hierarchy

Figure 7:
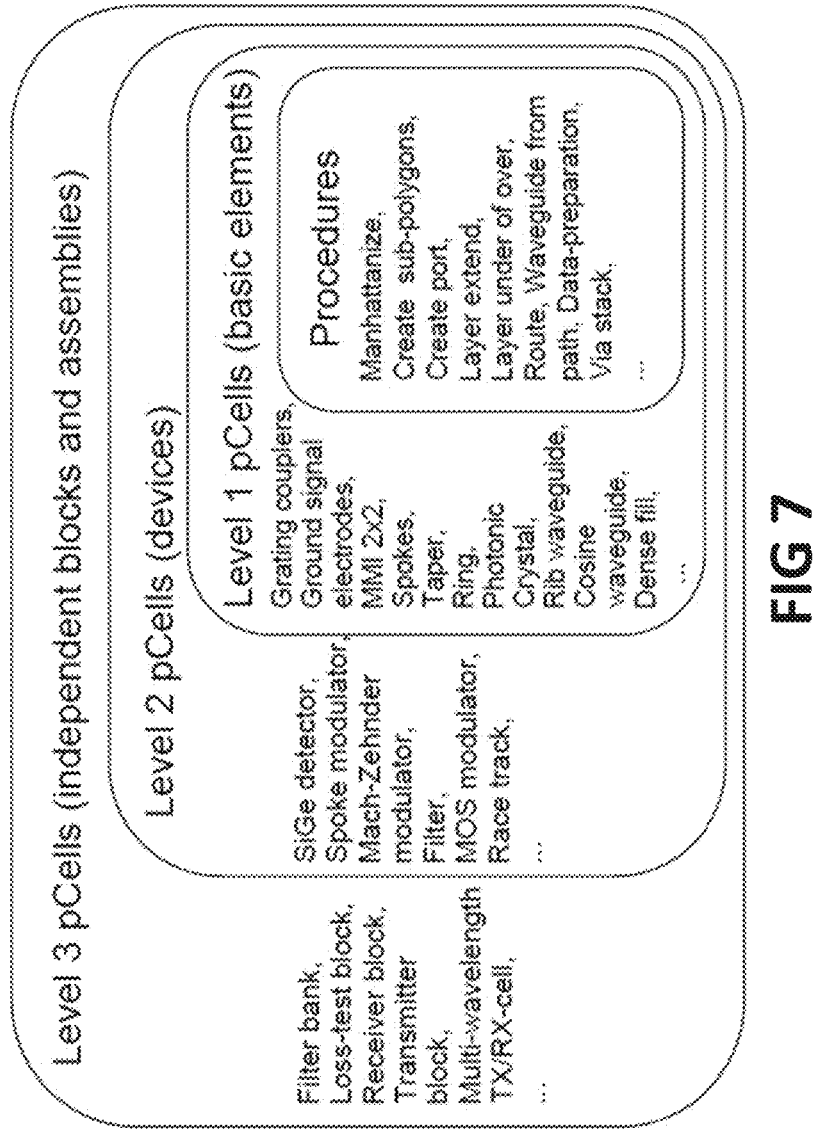
FIG. 7 is a diagram illustrating an exemplary arrangement of hierarchical levels of a photonics process design library that includes photonics design functions (e.g., "procedures") and photonics parameterized cells (pCells), according to some embodiments.

FIG. 7 is a diagram of a hierarchy of procedures, as well as pCells of the photonics process design library 132 shown in FIG. 1, according to some embodiments. As discussed above, in one embodiment the respective procedures and pCells in the library may be written in scripting language SKILL so as to extend the functionality of the electric-design-automation (EDA) tool Virtuoso by Cadence® to include photonic functionality. As shown in the example of FIG. 7, at the lowest level of the hierarchy are procedures such as manhattanization, creation of sub-polygons, creation of ports, extension of layers, under-of-over and over-of-under operations, routing of waveguides, data preparation, via stacking, etc. PCells may be built hierarchically starting with basic elements (e.g., grating couplers, ground signal electrodes, MMI 2×2, spokes, tapers, rings, photonic crystals, waveguides (e.g., rib, cosine), dense fill, straight elements, curves, global variables, etc.), to single devices (detectors (e.g., SiGe), modulators (e.g., spoke, Mach-Zehnder, MOS), optical filters, grating couplers, test structures, race tracks, multimode interference (MMI) devices, etc.), to independent blocks and chip assemblies (e.g., filter banks, loss-test blocks, receiver blocks, transmitter blocks, multi-wavelength transmitter/receiver cells, wavelength division multiplexing (WDM) assemblies, sweeps of test structures, etc.).

Figure 8:
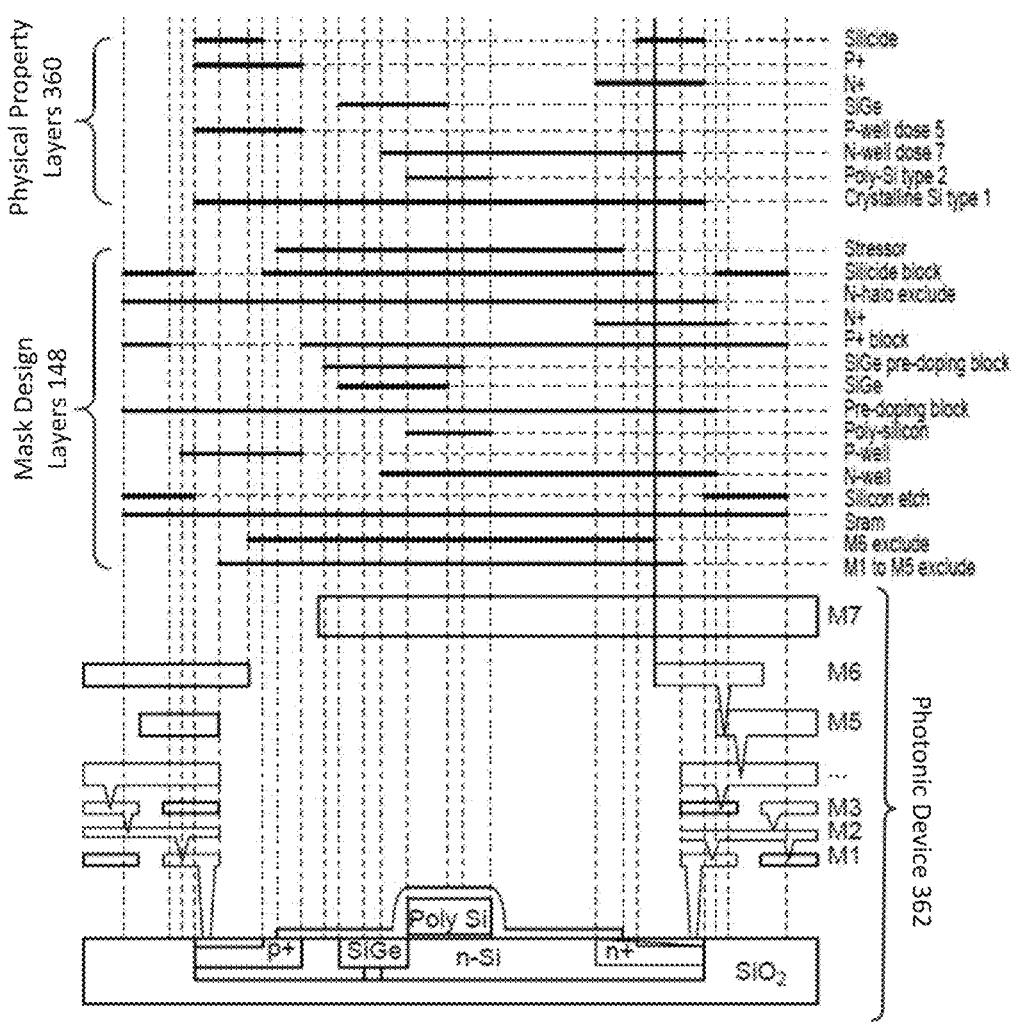
FIG. 8 is a cross-sectional rendering of a semiconductor photonic device together with associated physical property layers (photonics design layers) created by a photonic designer, and automatically-generated design rule compliant mask design layers for the physical layout of the photonic device, according to some embodiments.

Example of Physical Property Layers and Mask Design Layers for an Illustrative Photonic Device FIG. 8 is a cross-sectional rendering of a semiconductor photonic device 362 with corresponding fabrication masks (M1-M7), physical property layers 360, and derived mask design layers 148, according to some embodiments. To create a physical design, a designer draws shapes on one or more physical property (or "photonic") layers 360 each having a direct correspondence with the relevant parameters. For example, by drawing on "rxphot," a waveguide of silicon having the same shape will be fabricated in the final chip. The physical property layers 360 include one or more of silicide, P+, N+, SiGe, P-well, N-well, polysilicon, crystalline silicon, etc. As shown in FIG. 8, some physical property layers 360 correspond to a particular doping level (e.g., "P-well dose 5" and "N-well dose 7"). The shapes are drawn on physical property layers 360 irrespectively of design rules. For example, high-doping levels (N+ and P+) may be drawn with edges coincident with the silicon pattern. In a later data preparation step, these physical property layers 360 are translated into mask design layers 361, and the design rules are enforced. In one example, the derived mask design layers 361 include stressor, silicide block, N-halo exclude, N+, P+ block, SiGe, pre-doping block, polysilicon, P-well, N-well, silicon etch, SRAM, and metal exclude layers (e.g., "M6 exclude" and "M1 to M5 exclude"). One or more design rules (e.g., in a semiconductor-technology dependent parameter file as discussed above) may apply to each of the physical property layers 360. For example, a maximum width of the silicon germanium layer may be specified.

Data Preparation Example

Figure 9B:
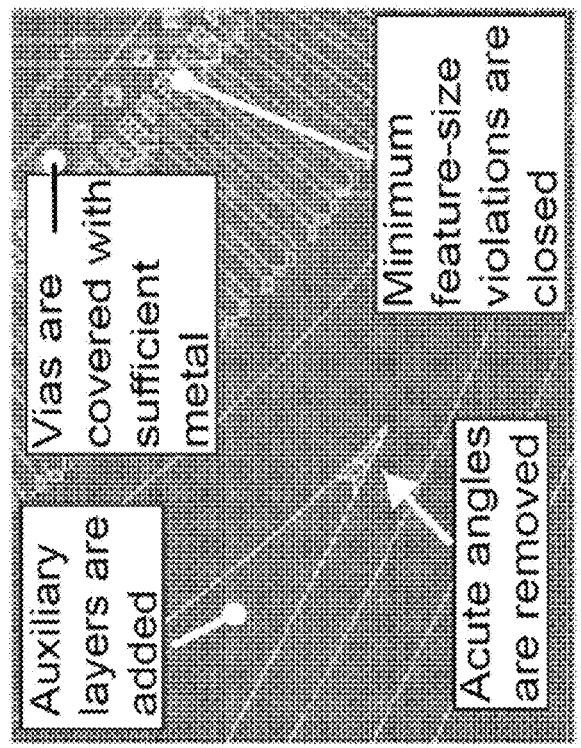
FIG. 9B is a modified version of the rendering of FIG. 9A after data preparation (DRC violation removal) has been performed, according to some embodiments.
Figure 9A:
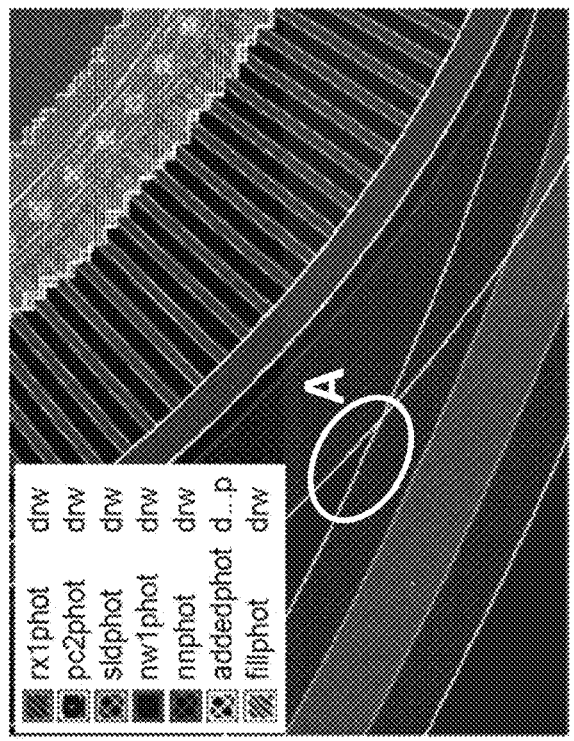
FIG. 9A is a rendering of a photonic device design including multiple physical property layers (photonics design layers) prior to data preparation, according to some embodiments.

To remove one or more DRC violations from one or more physical property layers defined by a designer, a data preparation procedure is described herein. FIGS. 9A-9B show physical property layers before and after data preparation, respectively. FIG. 9A is a rendering of a spoked-ring of crystalline silicon (rx1phot) covered with poly-silicon (pc2phot), silicide (sldphot) and an n-well implant (nw1phot), as well as an access waveguide (see bottom of FIG. 9A), prior to data preparation, according to some embodiments. In the circled region marked "A" in FIG. 9A, two waveguides join, and form an acute angle therebetween, which is a design rule violation. FIG. 9B shows the physical property layers of FIG. 9A after being translated (via the data preparation procedure) into technology-specific/auxiliary layers (e.g., a few tens), and DRC violations have been removed. As shown in the annotations of FIG. 9B, the acute angle of FIG. 9A has been removed, minimum feature-size violations have been closed, and vias have been covered with a minimum amount of metal (sufficient to satisfy one or more design rules). Note that although the access waveguide and the spoked-ring may have been DRC cleaned individually prior to placement, once they are placed close to one another, violations such as acute angles may appear. As such, in some examples, the removal of DRC violations is advantageously performed after the placement of the individual elements or devices.

Manhattanization

As noted above, manhattanization refers to the conversion of an arbitrary shape into an orthogonal polygon (i.e., on a manhattan grid), for example to enable sizing functions used to remove minimum feature size violations (discussed further below). In other words, the manhattanization procedure takes, as its input, a list of coordinates of a polygon, and returns coordinates of a "best-fit" polygon that comprises multiple orthogonal/manhattanized segments. In some implementations, manhattanization occurs automatically while a designer is creating a physical property layer, for example via automatic manhattanization of a new shape/polygon when defining a new pCell that is added to the photonics process design library. Alternatively or in addition, manhattanization occurs during data preparation as part of the DRC violation removal process. FIG. 10A is a rendering of an optical modulator design 1000A comprising a plurality of polygon shaped elements 1002A, according to some embodiments. The corners of the polygon shaped elements 1002A of FIG. 9A are not orthogonal, and the coordinate list(s) that define the modulator may accordingly be arbitrarily large/complex. FIG. 10B is a manhattanized version 1000B of the modulator design of FIG. 10A, wherein each of the polygon shaped elements 1002A in FIG. 10A has been transformed into a corresponding orthogonal polygon-shaped element 1002B. An example manhattanization procedure, written in SKILL, is as follows:

---

; This procedure takes as input a list of coordinates of a polygon and returns coordinates
; of the best-fit polygon made of orthogonal (Manhattan) segments. The new polygon is unique
; (does not depend for example from order of the input points) and is larger than the original
;           load(strcat(env(PCELLSKILL) "/0ProcedureManh.il"))

```
procedure( Manh(PolygonPoints ManhGridSize)
    let((
        PolygonPointsTemp
        Point            IndPoint
        XInside          YInside
        ThisPoint        NextPoint
        DeltaX           DeltaY
        NumPointsToAdd IndNewPoint
        X0               Y0
        StepX            StepY
        VectorialProduct1 VectorialProduct2
        PointsOrthogonal
        PointsOrthogonalRounded
        PointsOrthogonalRoundedUnique
        )
; Snapping original coordinates to manhattan grid (by rounding):
    PolygonPointsTemp = nil ; initialization.
    foreach(Point PolygonPoints
        PolygonPointsTemp = cons(list(ManhGridSize * round(xCoord(Point) /ManhGridSize)
            ManhGridSize * round/vCoord(Point)/ManhGridSize)) PolygonPointsTemp)
        ) ; end foreach.
    PolygonPoints = PolygonPointsTemp
; Adding last point to the beginning to ensure the polygon is closed:
    PolygonPoints = cons( nth(length(PolygonPoints)-1 Polygon Points) PolygonPoints)
    ; Determining the coordinate of a point which is certainly inside the convex envelope
        of the polygon (a kind of "center-of-mass")
        XInside = 0.0
        YInside = 0.0
        foreach(Point PolygonPoints ; Obs: Shape~>points returns nil on rectangles
            XInside = XInside + xCoord(Point)
            YInside = YInside + yCoord(Point)
            )
        XInside = XInside / length(PolygonPoints)
        YInside = YInside / length(PolygonPoints)
; Scanning all the points of the original list and adding points in-between.
        PointsOrthogonal = list(car( PolygonPoints )) ; initializing the new list of points
            with the first original point.
        PolygonPointsLoop = PolygonPoints
        for(IndPoint 0 length(PolygonPoints)-1 ; Making a loop on every point of the shape.
            ThisPoint = nth(IndPoint PolygonPoints)
            NextPoint = nth(IndPoint PolygonPoints)
            if(NextPoint = = nil then
                NextPoint = ThisPoint
            )
            DeltaX = xCoord(NextPoint)-xCoord(ThisPoint)
            DeltaY - yCoord(NextPoint)-yCoord(ThisPoint)
            PointsOrthogonal = cons( ThisPoint PointsOrthogonal) ;append(PointsOrthogonal list(ThisPoint))
            if( DeltaX = = 0.0 || DeltaY = = 0.0
            then ; ThisPoint and NextPoint are already on an orthogonal grid.
                PointsOrthogonal = cons( NextPoint PointsOrthogonal) ; append(PointsOrthogonal list(NextPoint))
            else ; ThisPoint and NextPoint are NOT on an orthogonal grid.
;    ******* GENERAL RULE FOR DETERMINING A UNIQUE DISCRETIZATION: X IS INCREMETED BEFORE Y IN EVERY
        AMBIGUOUS CASE (E.G. 45DEG) !! *****
                if( abs(DeltaX) > abs(DeltaY)
                then ; the segment to approximate is closer to the x-axis than the y-axis:
                    NumPointsToAdd = abs(round(DeltaY/ManhGridSize))
                X0 = XCoord(ThisPoint)
                Y0 = yCoord(ThisPoint)
                for(IndNewPoint 1 NumPointsToAdd)
                    StepX = round(DeltaY/abs(DeltaY)) * DeltaX/DeltaY * ManhGridSize
                    ;   idea: StepX = ManhGridSize * round( StepX / ManhGridSize ) ; rounding to the grid.
                    StepY = StepX * DeltaY / DeltaX
                    VectorialProduct1 = StepX * ( YInside-yCoord(ThisPoint) )-StepY * ( XInside-xCoord(ThisPoint) )
                    ; if positive, the center if the shape is on the left
                    VectorialProduct2 = StepX * 0.0-StepY * StepX ; if positive the vector ( StepX, 0.0) is on the left too
                    if( VectorialProduct1* VectorialProduct2 < 0 ; if both are positive, incrementing in X first is the bad choice:
                    then
                        PointsOrthogonal = cons(list( X0 + StepX Y0             ) PointsOrthogonal); incrementing X first
                        PointsOrthogonal = cons(list( X0 + StepX Y0 + StepY) PoinstOrthogonal)
                    else
                        PointsOrthogonal = cons(list( X0                Y0 + StepY) PointsOrthogonal); incrementing Y first
                        PointsOrthogonal = cons(list( X0 + StepX Y0 + StepY) PointsOrthogonal);
                    )
                    X0 = X0 + StepX
                    Y0 = Y0 + StepY
                )
            else ; the segment to approximate is closer to the y-axis than the x-axis
                NumPointsToAdd = abs(round(DeltaX/ManhGridSize))
```

```
        X0 = XCoord(ThisPoint)
        Y0 = yCoord(ThisPoint)
        for(IndNewPoint 1 NumPointsToAdd
            StepY = round(DeltaX/abs(DeltaX)) * DeltaY/DeltaX * ManhGridSize
            StepX = StepY * DeltaX / DeltaY
            VentorialProduct1 = StepX * ( YInside-yCoord(ThisPoint) )-StepY *( XInside-xCoord(ThisPoint) )
            ; if positive, the center if the shape is on the left
            VectorialProduct2 = StepX * 0.0-StepY * StepX ; if positive the vector ( StepX, 0.0) is on the left too
            if( VectorialProduct1 * VectorialProduct2 < 0 ; if both are positive, incrementing in X first is the bad choice:
                then
                    PointsOrthogonal = cons(list( X0 + StepX Y0              ) PointsOrthogonal); incrementing X first
                    PointsOrthogonal = cons(list( X0 + StepX Y0 + StepY      ) PointsOrthogonal)
                else
                    PointsOrthogonal = cons(list( X0                Y0 + StepY ) PointsOrthogonal; incrementing Y first
                    PointsOrthogonal = cons(list( X0 + StepX Y0 + StepY ) PointsOrthogonal;
            )
            X0 = X0 + StepX
            Y0 = Y0 + StepY
        )
    )
    PolygonpontsLoop = odr(PolygonPointsLoop)
  ) ; End for IndPoint
; Snapping final coordinates to grid (by rounding):
  PointsOrthogonalRounded = nil ; initialization.
  foreach(Point PointsOrthgonal
      PointsOrthogonalRounded = cons (list(ManhGridSize * round(xCoord(Point)/ManhGridSize)
          ManhGridSize = round(yCoord(Point)/ManhGridSize)) PointsOrthogonalRounded)
  ) ; end foreach.
; Removing double points:
      PointsOrthogonalRoundedUnique = RemoveConsecutiveDoubles(PointsOrthogonalRounded)
; Returning result:
      PointsOrthogonalRoundedUnique          ; procedure returns this list
  ) ;end of body of code (let)
) ; end of procedure .
```

De-Manhattanization

A designer may elect to de-manhattanize a manhattanized physical property layer, mask layer, or pCell, for example to reduce and/or compress the file size associated with a physical property layer, mask layer, or pCell (e.g., for portability) or for viewing purposes prior to DRC violation removal. Any physical property layer, mask layer, or pCell that has been de-manhattanized is subsequently "re-manhattanized," via the manhattanization procedure described above, prior to performing data preparation or otherwise removing DRC violations. An example de-manhattanization procedure, written in SKILL, is as follows:

```
; This procedure de-manhattanize every shape in a CellView by removing every second point of every shape.
; Then it decimates the point, until the distance between points is larger than Threshold.
: If an if three points happen to have a DeltaX or DeltaY larger than Minfeature, they are not removed.
;
;        load(strcat(env(PCELLSXILL) "/0ProcedureDeManh.il"))
procedure( DeManh(CellView Threshold @optional (MinFeature GlobalMinFeature)
    let((
        GridSize
        NumVertices
        ThresholdLocal
        Iteration
        OriginalShape          OriginalShapes
        OriginalPolygon        OriginalPolygons
        OriginalPoints
        NewShapes
        NewPoints
        CoordsOfSubPolygon         CoordsOfSubPolygons
        Ind
        Point0
        Point1
        Point2
        DeltaX
        DeltaY
        TempShapes
        DeManhMe         LoopCount         Delta PointMem
        DeManhPolygone DeManhMeCount Point NumIterations NPoints
        OriginalPointsLoop
        )
    ; Importing global variables:
        GridSize = GlobalGridSizeMinimum
        NumVertices = GlobalNumVertices ; number of vertices used for boolean generation
    ; Iterating 5 times the routine. The first time ThresholdLocal is set to GridSize and the grid
```

-continued

```
; is demanhattanized. The following times it is set to Threshold, and points are decimated.
    ThresholdLocal = GridSize
;check shapes to see if they should be DeManh or not. Shapes on a GlobalGridSize grid will skip DeManh.
;Shapes on GlobalGridSizeMinimum will go through DeManh.
    Flatten(CellView)
    OriginalShapes = CellView~>shapes
    OriginalPolygons = setof( OriginalShape OriginalShapes OriginalShape~>objType = = "polygon")
    OriginalPolygons = setof( OriginalPolygon OriginalPolygons OriginalPolygon~>purpose ! = "dataprep")
    ; excluding dataprep dataype
    OriginalPolygons = setof ( OriginalPolygon OriginalPolygons OriginalPolygon~>purpose ! = "portphot")
    ; excluding portphot dataype
    DeManhPolygons = nil; initialization of shapes to DeManh
    DeltaX=0.0
    DeltaY=0.0
    DeManhMeCount = 0
    foreach(OriginalPolygon OriginalPolygons
       OriginalPoints = OriginalPolygon~>points
       LoopCount = 0
       DeManhMe = nil
       NPoints = OriginalPolygon~>nPoints
       while(and(LoopCount<NPoints not (DeManhMe))
          Point = nth(LoopCount OriginalPoints)
          if(LoopCount>0 then
             DeltaX = abs(xCoord(Point)-xCoord(PointMem))
             DeltaY = abs(yCoord(Point)-yCoord(PointMem))
             if(or(DeltaX==0.0 DeltaY==0.0)
             then
                Delta = round(max(DeltaX DeltaY)/GlobalGridSizeMinimum)
             ; get nonzero value in units of GlobalGridSizeMinimum
             else
                Delta = round(min(DeltaX DeltaY)/GlobalGridSizeMinimum)
             ; get min value in units of GlobalGridSizeMinimum
             )
             if(Delta==1
             then
                DeManhMe = t
                ++DeManhMeCount
             )
          )
          ++LoopCount
          PointMem = Point
       );end while
       if(DeManhMe
       then
          DeManhPolygons = cons( Original Polygon DeManhPolygons)
       );end if
    );end foreach
    OriginalPolygons = DeManhPolygons
    NumIterations = 5
    fprintf(woport = Found %L shapes to DeManhattanize\n" list(DeManhMeCount))
    for(Iteration 0 NumIterations)
       fprintf(woport "DeManh iteration %L of %L.\n" list(Iteration) list(NumIteration)
       NewShapes = nil ; initialization
       LoopCount = 1 ; initialization
       foreach(OriginalPolygon OriginalPolygons
          NPoints=OriginalPolygon~>nPoints
          fprintf(woport "DeManhattanizing shape %L out of %L\n" list(LoopCount) list(DeManhMeCount))
          ++LoopCount
          OriginalPoints = OriginalPolygon~>points
          NewPoints = nil; initialization.
          if( NPoints>100; arbitrary choice
          then
          Ind = 0 ; initialization
          OriginalPointsLoop = OriginalPoints
          while( Ind<Npoints-1
             ;;Point0 = nth(Ind OriginalPoints)
             ;;Point1 = nth(Ind+1 OriginalPoints)
             ;Point0 = nth(min(Ind NPoints=1)                      OriginalPoints)
             Point0=car(OriginalPointsLoop)
             ;Point1 = nth(min(Ind+1 NPoints-1)                    OriginalPoints)
             Point1-cadr(OriginalPointsLoop)
             ;Point2 = nth(min(Ind+2 NPoints-1)                    OriginalPoints)
             Point2=caddr(originalPointsLoop)
             if(not(Car(Point2))
             then
                Point2 = Point1
             )
             ;DeltaX = abs( nth(0 Point2)-nth(0 Point0) )
             DeltaX = abs( car(Point2)-car(Point0) )
```

```
            DeltaY = abs( cadr(Point2)-cadr(Point0) )
            ; The 1.01 is to prevent wrong comparison between identical numbers.
            ; The MinFeature condition prevents edges connected to things longer than that to be
            ; deleted (such as metal around vias)
            if( or( and( DeltaX>1.01*ThresholdLocal DeltaY>1.01*ThresholdLocal) DeltaX>MinFeature DeltaY>MinFeature)
              then
                NewPoints = cons( Point0 NewPoints)
                NewPoints = cons( Point1 NewPoints)
                Ind - Ind+2
              else
                NewPoints = cons( Point0 NewPoints)
                Ind = Ind+2
            ) ; end if.
            OriginalPointsLoop=cddr(OriginalPointsLoop)
          )
          ; Adding the first point at the end:
          NewPoints = cons( nth(0 OriginalPoints) NewPoints)
          else
            NewPoints = OriginalPoints
          ) ; end if.
          CoordsOfSuPolygons = CoordPrep(NewPoints,GlobalGridSizeMinimum) ; See procedure 0ProcedureCoordPrep.il
          ; Creating a subpolygon for each:
          TempShapes = nil ; initialization
          foreach(CoordsOfSubPolygon CoordsOfSubPolygons
            TempShapes = cons( dbCreatePolygon( CellView OriginalPolygon~>lpp coordsofSubPolygons ) TempShapes)
          )
          ; this merges the subpolygons together in one list:
          NewShapes = append( dbLayerSize(CellView OriginalPolygon~>lpp TempShapes 0.0 NumVertices) NewShapes)
          DeleteShapes(TempShapes)
        ) ; end foreach.
        DeleteShapes(OriginalPolygons)
        OriginalPolygons = NewShapes
        ThresholdLocal = Threshold
      ) ; end of for on Iteration.
    ) ;end of body of code (let)
) ; end of procedure
```

Creating a Polygon

Figure 11:
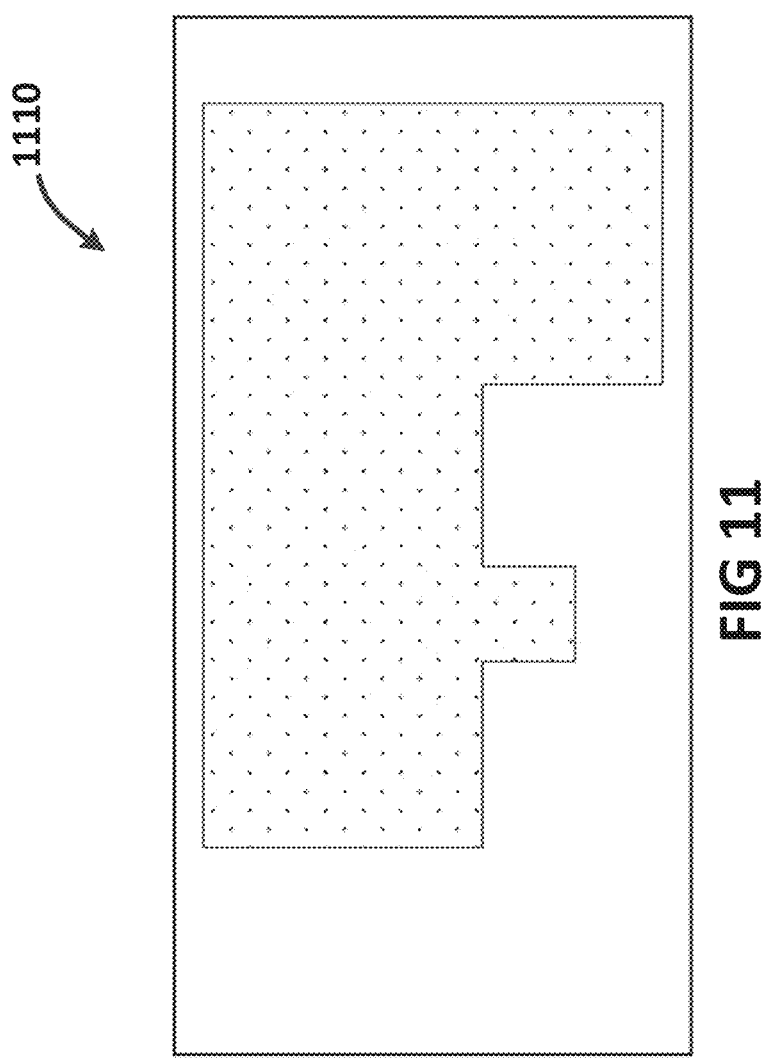
FIG. 11 is a rendering of a polygon, according to some embodiments.

FIG. 11 is a rendering of an orthogonal, polygon-shaped element 1110 that may be defined, for example, in a photonics pCell, according to some embodiments. An example in SKILL of a pCell definition for the polygon of FIG. 11, including the coordinates that define the edges of the polygon, is as follows:

```
pcDefineCell(
   list( ddGetObj("LTP1") "1_Test_Polygon" "layout")
   ; parameters and their optional defaults:
   (
      (Xx              "X")
   ) ;end of parameter list
   let((x
        y
       )
   dbCreatePolygon( pcCellView list( "rx"    "drawing")
                  list(        0.02:0.020.04:0.02 0.04:0.01 0.05:0.01 ).05:0.02
                  0.07:0.02 0.07:0.0 0.10:0.0 0.10:0.05 0.02:0.05 ))
   ) ;end of body of code (let)
) ;end of pcell definitions
```

Sizing

As discussed above with reference to FIG. 4, a data preparation process can include a "sizing" (in other words, a "resizing") of one or more shapes (or spaces therebetween) of a physical property layer. Sizing, as used herein, includes the following steps: (1) for each vertical or horizontal segment defining a polygon contour, determine an interior side of the segment (i.e., facing an inside of the polygon); (2) for each vertical segment, translate horizontally by a sizing factor (e.g., by a factor of "+d" outward toward the outside/ exterior of the polygon (referred to as an "over" operation) or by a factor of "-d" inward toward an inside/interior of the polygon (referred to as an "under" operation)); (3) for each horizontal segment, translate vertically by "+d" (outward toward the outside/exterior of the polygon (referred to as an "over" operation)) or "-d" (inward toward an inside/interior of the polygon (referred to as an "under" operation), using the same value of "d" as in step (2); (4) if a translated segment has a non-intersecting endpoint, extend the segment such that it intersects and extends beyond a nearest orthogonal segment; and (5) define a new contour of a re-sized orthogonal polygon, the new contour comprising the set of outermost segments (for an "over" operation), or innermost segments (for an "under" operation) that define a single closed polygon.

In some implementations, sizing functions are nested. For example, an over sizing operation may be performed first, followed by an under sizing operation, referred to as an "under-of-over" (i.e., over(under)) operation. Under-of-over operations are useful, for example, to remove gaps that are narrower than a minimum space (i.e., between two shapes, elements, devices, etc.) set by a design rule (in other words, where a gap is too small, causing a design rule violation). Similarly, an under sizing operation may be performed first, followed by an over sizing operation, referred to as an "over-of-under" operation. Over-of-under operations are useful, for example, to remove features that are narrower than a minimum feature size (i.e., of a shape, element, device, etc.) set by a design rule (in other words, where a feature has a dimension, such as a width or a length, that is too small, causing a design rule violation). Further "nesting" of sizing operations can also be performed, for example a first over sizing operation, followed by a first under sizing operation, followed by a second under sizing operation, followed by a second over sizing operation may collectively be referred to as an "over-of-under-of-under-of-over" sizing (i.e., over(under(under(over)))) operation. An over-of-under-of-under-of-over sizing operation may be used, for example, to remove both minimum feature size and minimum spacing violations from a physical property layer.

Figure 12:
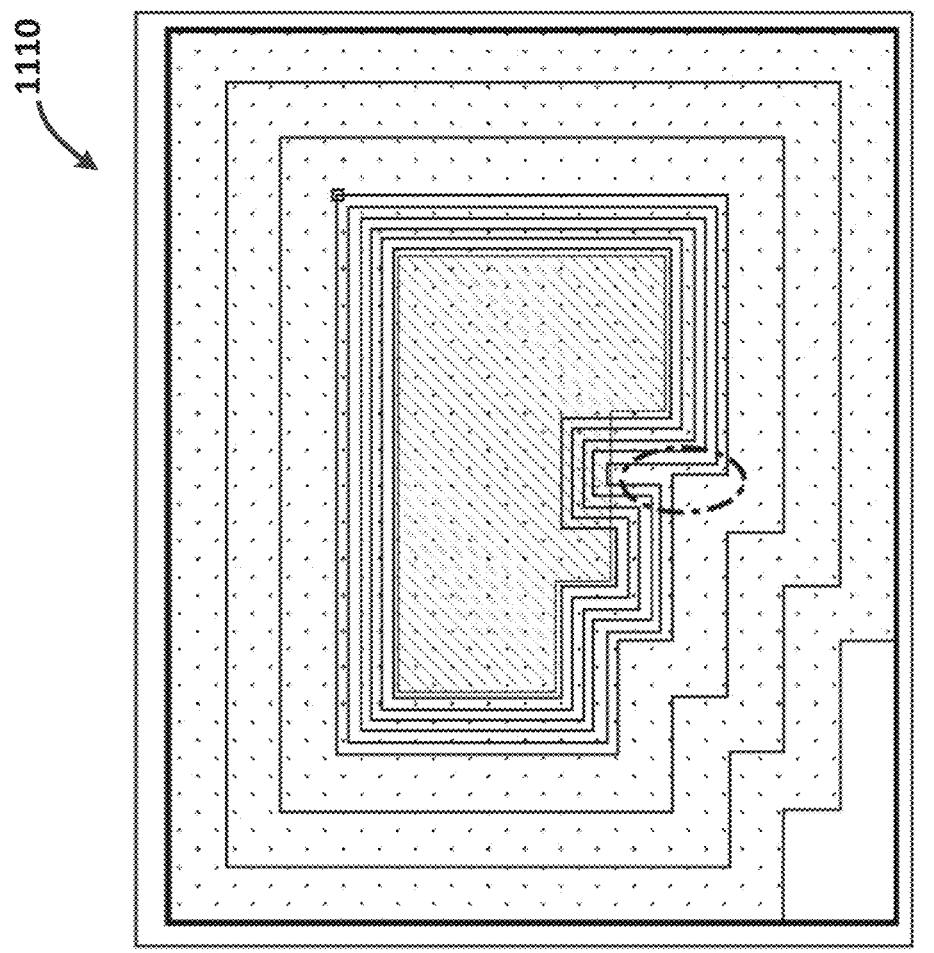
FIG. 12 shows a sizing operation being performed on the polygon of FIG. 11.

FIG. 12 shows an over-of-under (or "overunder") sizing operation being performed on the polygon of FIG. 11. An example in SKILL of a sizing operation for the polygon of FIG. 11 (named "pcCellView") is as follows (where "LTP1" is the project name (i.e., "low temperature photonics 1")):

```
pcDefinePCell(
list( ddGetObj("LTP1") "1_Test_Layer_Size" "layout")
; parameters and their optional defaults
(
(X_x             "x")
) ;end of parameter list
let((Cv)
Cv = dbOpenCellViewByType("LTP1" "1_Test_Polygon" "layout")
; dbLayerSize( Cv list("rx" "drawing") Cv~>shapes 1.0 )
; dbLayerSize( output file, output layer, input shape, size dimension)
dbLayerSize( pcCellView list("rx" "drawing") Cv~>shapes 0.0 )
; Eliminating small gaps, "overunder" operation:
dbLayerSize( pcCellview list("rx" "drawing") CV~>shapes 0.01 )
dbLayerSize( pcCellview list("pc" "drawing") pcCellView~>shapes −0.011
)
; expanding in small steps:
dbLayerSize( pcCellview list("rx" "drawing") CV~>shapes 0.002 )
dbLayerSize( pcCellview list("rx" "drawing") CV~>shapes 0.004 )
dbLayerSize( pcCellview list("rx" "drawing") CV~>shapes 0.006 )
dbLayerSize( pcCellview list("rx" "drawing") CV~>shapes 0.008 )
dbLayerSize( pcCellview list("rx" "drawing") CV~>shapes 0.02 )
dbLayerSize( pcCellview list("rx" "drawing") CV~>shapes 0.03 )
dbLayerSize( pcCellview list("rx" "drawing") CV~>shapes 0.04 )
```

Conceptually, during an over-of-under sizing, the area "inside" of the polygon (i.e., the area enclosed by a contour) and the area "outside" of the polygon are respectively identified. Segments of the polygon that define the boundary of the polygon are shifted towards the outside, and each segment is extended (i.e., made infinitely long). The shifted segments, collectively, define a new contour. Any line segments lying within the new contour are removed (they disappear—see circled region in FIG. 12). Segments of the new contour are then shifted back toward the inside, and the shape of the new contour is retained. As such, portions of the starting polygon in which line segments were too close together (i.e., violating a design rule) have been "remediated" such that no two line segments of the over-of-under sized polygon are too close together.

FIGS. 13A-13D illustrate a process for removing minimum-spacing design-rule violations (e.g., acute angles, shapes that are too close together, etc.), according to some embodiments. The process shown in FIGS. 13A-13D can be performed, for example, on an acute angle such as is shown in the circled region marked "A" in FIG. 9A, discussed above. Specifically, FIG. 13A shows a rendering of a polygon that violates a minimum-spacing design rule, in that the line segments forming the acute angle are too close together in the vicinity of the vertex. The polygon of FIG. 13A can include an arbitrarily large list of coordinates (e.g., more than 4,000 points) that have been obtained, for example, by evaluating a mathematical function (such as a sinus or a circle) or by integrating a differential equation (see, e.g., the spokes in FIG. 17) corresponding to a shape/polygon in a physical property layer. This list of coordinates is then passed to a custom procedure that "tiles" (i.e., sub-divides) the corresponding polygon into multiple sub-polygons each comprising fewer than 4,000 points (the absolute maximum tolerated by Cadence®) even after a manhattanization step. Each list of coordinates is "manhattanized," meaning that, as noted above, the original polygon is converted to a corresponding polygon formed by orthogonal segments (on a Manhattan grid), as shown in FIG. 13B. A grid size (e.g., 1 nm, 10 nm, 100 nm, or any other grid size that is suitable for approximating a continuous boundary of a photonic component) may be specified for the manhattanization step. One advantage of using orthogonal polygons is that the sizing operations (e.g., enlarging or diminishing the dimension of a polygon) are well-defined. If "2d" is the minimum feature size tolerated on a specific layer, this layer is first sized by a "positive" amount, "d," as shown in FIG. 13C (an "over" operation). This operation closes gaps between edges that are spaced less than 2d from each other. In other words, edges of the polygon that are spaced 2d or less apart merge and/or are eliminated. The polygon is subsequently sized by "-d," (see FIG. 13D—an "under" operation), and does not return to its original form/contour, but rather to a form/contour in which all opposite edges are separated by more than "2d." The polygon is thus re-sized twice (once by "d" and once by "-d"), and the minimum spacing DRC violation has been removed. Note that if the acute angle in FIG. 13A was formed by only three points and no manhattanization was used, the over-under operation would have left the polygon shape unaltered. In some examples, the polygon of FIG. 13A is defined by at least one non-manhattanized segment. In other examples, the polygon of FIG. 13A has previously been manhattanized (for example, automatically when a designer creates a pCell, and/or according to one or more parameters set forth by a semiconductor technology-dependent parameter file, such as a global variables file), but with a smaller "grid size" (or "step" size) than is applied during the manhattanization step shown in FIG. 13B. An example of a pre-manhattanized polygon with a design rule violation is shown and described with reference to FIGS. 14A-14C, below. Using a relatively coarse grid during the manhattanization step of FIG. 13B results in fewer data points/coordinates, and hence less processing complexity during the sizing operations shown in FIGS. 13C-13D.

An example in SKILL of an over-of-under sizing operation is as follows:

```
; Importing global variables:
GridSize = GlobalGridSize
NumVertices = GlobalNumVertices ; number of vertices used for boolean generation
```

```
; Rounding per excess to the grid:
    SizeAmount = GridSize*ceiling(SizeAmount/GridSize)
; Flattening
    Flatten(CellView)
; finding the shapes with the correct layer purpose pair (LppIn):
    Shapes = setof(Shape CellView~>shapes Shape~>lpp = = LppIn)
; Making Under then Over:
    Under = dbLayerSize(CellView LppOut Shapes -SizeAmount NumVertices)
    OverOfUnder = dbLayerSize(CellView LppOut Under SizeAmount NumVertices) ; These are the final shapes.
    ReturnShapes = OverOfUnder
```

According to the code snippet above, the line Under=dbLayerSize(CellView LppOut Shapes-SizeAmount NumVertices) takes the shapes in "Shapes," and writes them on the layer "LppOut" after having sized them by "-SizeAmount."

After the data preparation step, a standard design rule deck (e.g., a DRC for electrical designs provided by a CMOS foundry) may be executed to ensure that all rules are correctly enforced. In addition, all shapes that have been added or removed automatically during design rule cleaning can be copied onto special layers for further visual inspection, if needed.

Figure 14C:
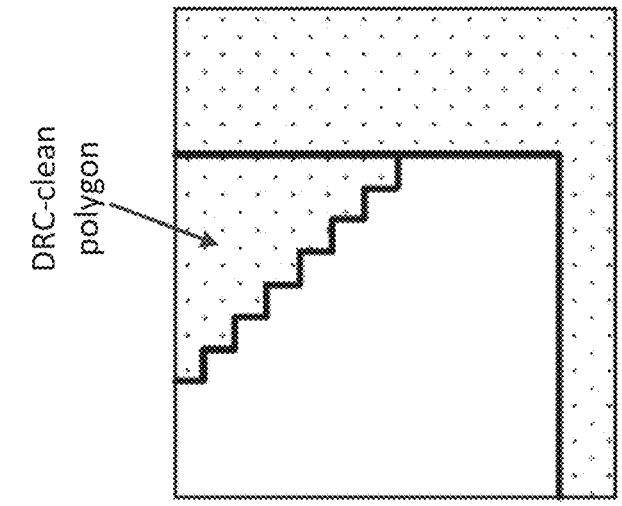
FIG. 14A-14C show an over-under sizing operation according to some embodiments.
Figure 14B:
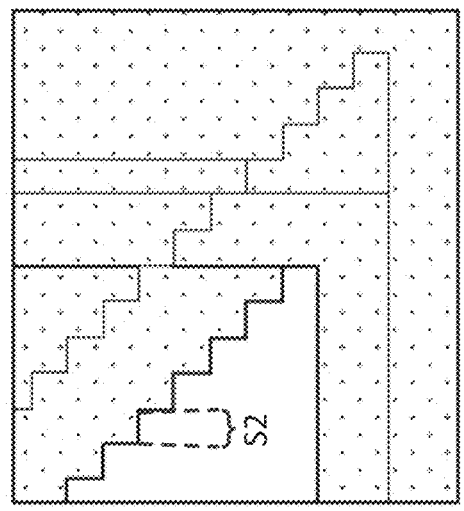
Figure 14A:
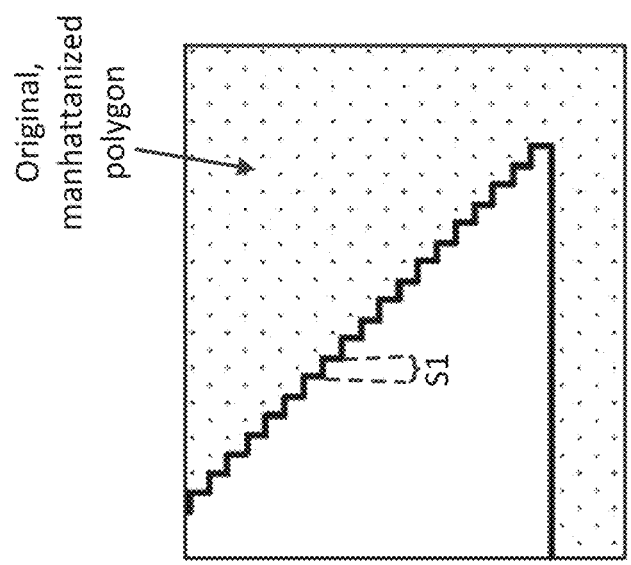

As noted above, FIGS. 14A-14C show a further example of an over-under sizing operation to avoid DRC violations, in which the "starting" polygon (the polygon appearing in FIG. 14A) has already previously been manhattanized, onto a grid having a first size "S 1" (e.g., 10 nm). The polygon of FIG. 14A includes an acute angle DRC violation (i.e., minimum spacing violation). FIG. 13B shows the data preparation steps, including a further manhattanization step using a grid size "S2" that is larger than "S1," as well as "over" and "under" operations (similar to the operations described above with reference to FIGS. 13C-13D), and FIG. 14C shows the polygon of FIG. 14A after modification by the data preparation procedure such that it is DRC clean. An example in SKILL of the over-under sizing operation of FIG. 14B is as follows:

```
Cv = dbOpenCellViewByType("LTP1" "1_Test_Shape_Generic_To_Orthogonal" "layout")
; Eliminating small gaps, "overunder" operation:
dbLayerSize( pcCellView list("pc1phot" "drawing") CV~>shapes 0.020 )
dbLayerSize( pcCellView list("pc2phot" "drawing") pcCellView~>shapes -0.020 )
```

With reference to the code snippet above, a "sizing up" (by 20 nm) of all shapes in the file "1_Test_Shape_Generic_To_Orthogonal" within project "LTP1" is performed, followed by a "sizing down" (also by 20 nm) of all shapes in that file.

Boolean Operations

Figure 15B:
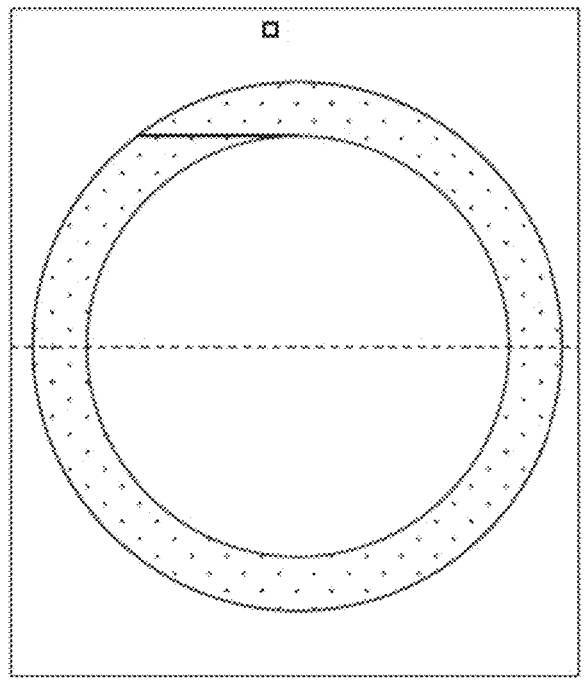
FIG. 15B is a rendering of a ring generated by performing a Boolean difference (AND NOT) operation on the rendering of FIG. 15A, according to some embodiments.
Figure 15A:
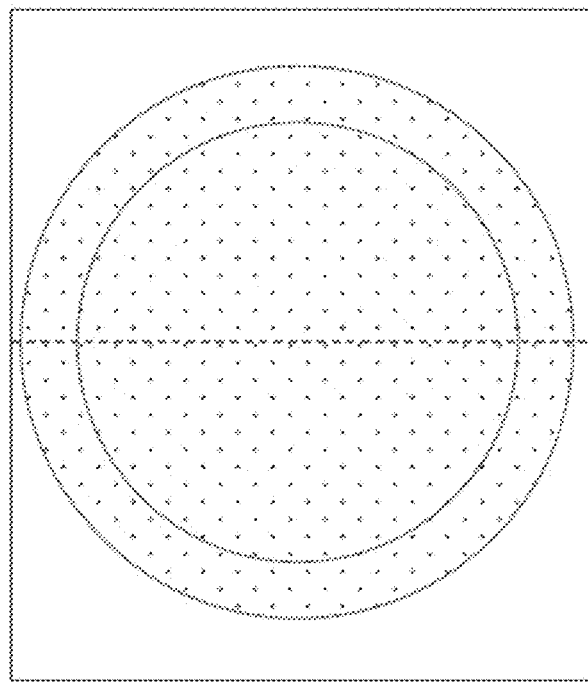
FIG. 15A is a rendering of two concentric circles, according to some embodiments.

In some embodiments, a photonic design tool is configured to perform Boolean operations to create custom and/or complex structures (e.g., holes in photonic crystals, rings, etc.). Boolean creation of a ring, according to some embodiments, is shown in FIGS. 15A-15B. FIG. 15A is a rendering of two concentric circles, and FIG. 15B is a rendering of a ring generated by performing a Boolean difference operation on the rendering of FIG. 15A. An example in SKILL of the Boolean operation shown in FIGS. 15A-15B is as follows:

```
InnerCircle = dbCreatePolygon( pcCellview list( "rxphot" "drawing") CoordsCircle)
Ring = dbLayerAndNot( pcCellView list( "pc1phot" "drawing") list(OuterCircle) list(InnerCircle) )
dbDeleteObject(InnerCircle)
deDeleteObject(OuterCircle)
```

The command "dbLayerAndNot" performs a Boolean (i.e., OuterCircle AND NOT InnerCircle) subtraction of the inner circle of FIG. 15A from the larger circle of FIG. 15A, resulting in the ring of FIG. 15B (the difference between the inner circle of FIG. 15A and the outer circle of FIG. 15B).

An example in SKILL of the generation of a ring is as follows:

```
; Importing global variables:
    NumVerticies = GlobalNumVertices ; number of vertices used for boolean generation
    Pi = GlobalPi
```

```
    GridSize = GlobalGridSize
    EdgeLength = GlobalEdgeLength
; Making the circles:
    ;;Num = round(2.0 * 3.14159 * ROut / 0.001 / 10.0) ; Making about one point every 10 nm.
    Num = round(2.0 * 3.14159 * ROut / EdgeLength) ; Making about one point every 10 nm.
    X0 = 0.0
    Y0 = 0.0
; Making the outer circle
    R = ROut
    Coords = nil ; initialization.
    For (Ind 1 Num-1
        Coords = cons( list(X0 + Rksin(2*(3.14159*Ind/Num) Y0 + Rkcos(2*3.14159*Ind/Num)) Coords)
    )
    CircleOut = CreateSubPolygons(pcCellView Lpp Coords ManhGridSize ManhattanTOrNil)
    ; Making the inner part, unless the ring is a full disk:
      if( ROut>RingWidth+GridSize
      then
      ; Making the inner radius
        R = ROut-RingWidth
        Coords = nil ; initialization.
        for(Ind 1 Num-1
          Coords = cons( list(X0 + Rksin(2*3.14159*Ind/Num) Y0 + Rkcos(2*3.14159*Ind/Num)) Coords)
        )
        CircleIn = CreateSubPolygons(pcCellview Lpp Coords ManhGridSize ManhattanTOrNil)
      ; Creating the Ring as difference of the two circles
        Ring = dbLayerAndNot(pcCellView Lpp CircleOut CircleIn NumVertices)
      ; Deleting useless shapes:
        DeleteShapes(CircleOut)
        DeleteShapes(CircleIn)
      ) ; end if.
    ) ;end of body of code (let)
) ;end of pcell definition
```

Figure 15D:
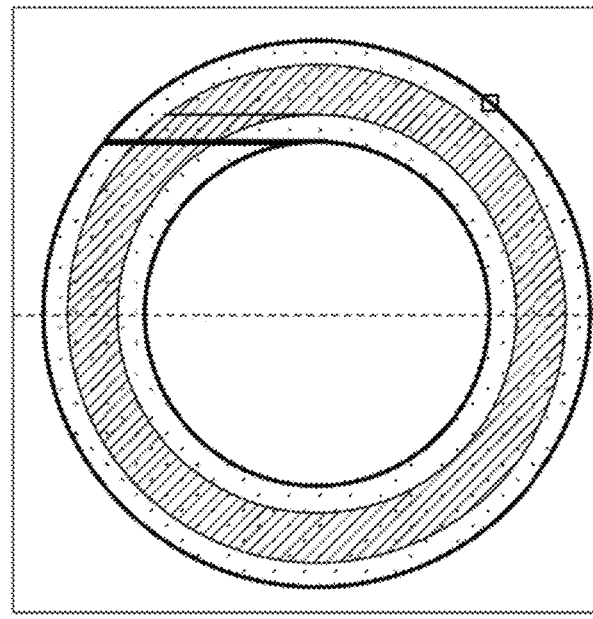
FIGS. 15C and 15D show an over-under operation after the AND NOT operation of FIG. 15B.
Figure 15C:
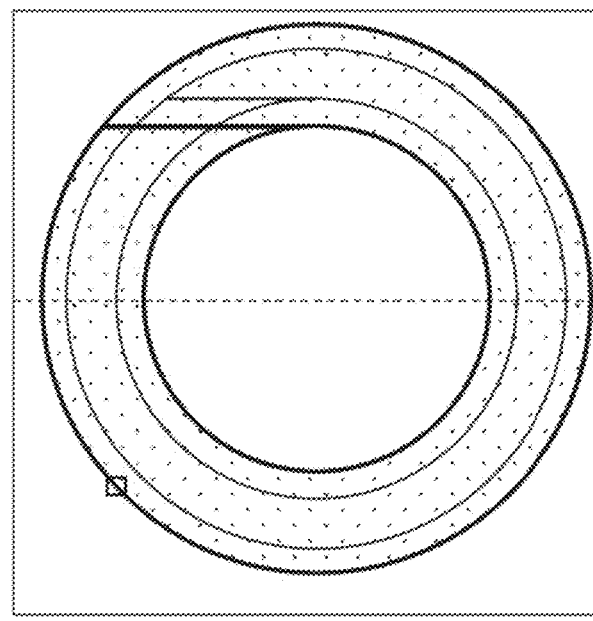

FIGS. 15C and 15D show an over-under operation after the AND NOT operation of FIG. 14B, as follows:

```
InnerCircle = dbCreatePolygon( pcCellView list( "rxphot"          "drawing") CoordsCircle)
Ring = dbLayerAndNot( pcCellView list( "pclphot"      "drawing") list(OuterCircle) list(InnerCircle) )
dbDeleteObject(InnerCircle)
dbDeleteObject(OuterCircle)
dblayerSize( pcCellView list("pc2phot" "drawing") pcCellView~>shapes 0.2 )
; dbDeleteObject(Ring)
dbLayerSize( pcCellView list("noniagtj" "drawing") pcCellView~>shapes –0.2)
```

Examples of Boolean operations available in SKILL include AND ("dbLayerAnd"), OR ("dbLayerOr"), XOR ("dbLayerXor"), SIZE ("dbLayerSize"), TILE ("dbLayerTile"), STRADDLE ("dbLayerStraddle"), NO HOLES ("dbLayerNoHoles"), HOLES ("dbLayerHoles"), INSIDE ("dbLayerinside"), OUTSIDE ("dbLayerOutside"), and ENCLOSE ("dbLayerEnclose").

Creation of Fill Blocks

Figure 16A:
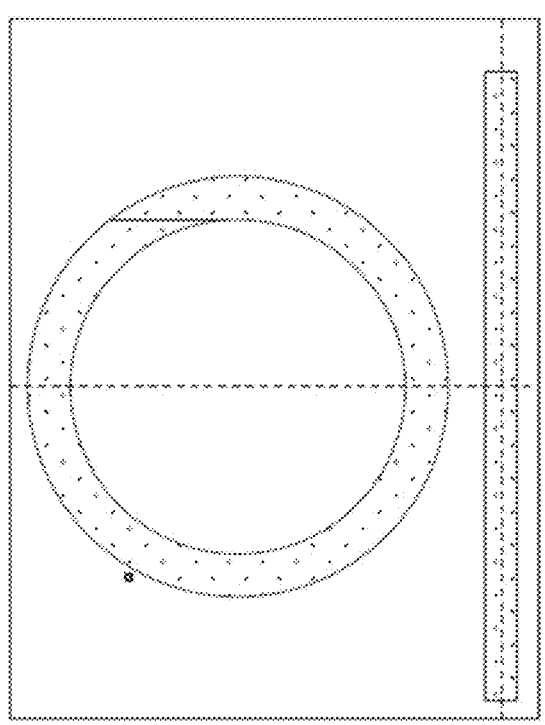
FIG. 16A is a rendering of a crystalline silicon optical modulator, according to some embodiments.
Figure 16B:
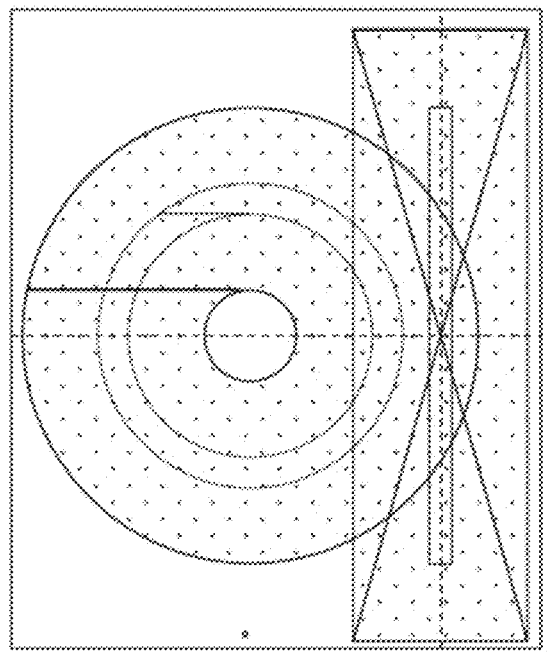
FIG. 16B shows the modulator of FIG. 16A with a fill operation applied, according to some embodiments.

In some embodiments, elements or devices are surrounded by a fill layer during data preparation, for example to ensure that local material density rules are met. An example of the creation of a fill block is shown in FIGS. 16A-16B. FIG. 16A is a rendering of a crystalline silicon modulator, according to some embodiments, and FIG. 16B shows the modulator of FIG. 16A after application of a fill block operation. An example in SKILL of the fill block operation shown in FIG. 16B is as follows:

```
Cv = dbOpenCellViewByType("LTP1" "1_Test_Toy_Modulator" "layout")
; Working on rxphot
foreach( Shape CV~>shapes
if( Shape~>layerName == "rxphot"
then
;printf("Good layer \n")
; Creating the silicon on the IBM layer
dbLayerSize( pcCellView list("rx" "drawing") list(Shape) 0.0 )
; Creating fill block upt to bl included.
FillblockOverSize = 1.0
dbLayerSize( pcCellView list("rx"    "exclude_x") list(Shape) FillBlockOverSize )
dbLayerSize( pcCellView list("pc"    "exclude_x") list(Shape) FillBlockOverSize )
dbLayerSize( pcCellView list("m1"    "exclude_x") list(Shape) FillBlockOverSize )
```

In some embodiments, an "exclude layer" (i.e., no fill) is desirable. For example, a designer may not want autofill metal on top of a grating coupler, since it would block light from entering/exiting the chip.

Example Devices

Figure 17:
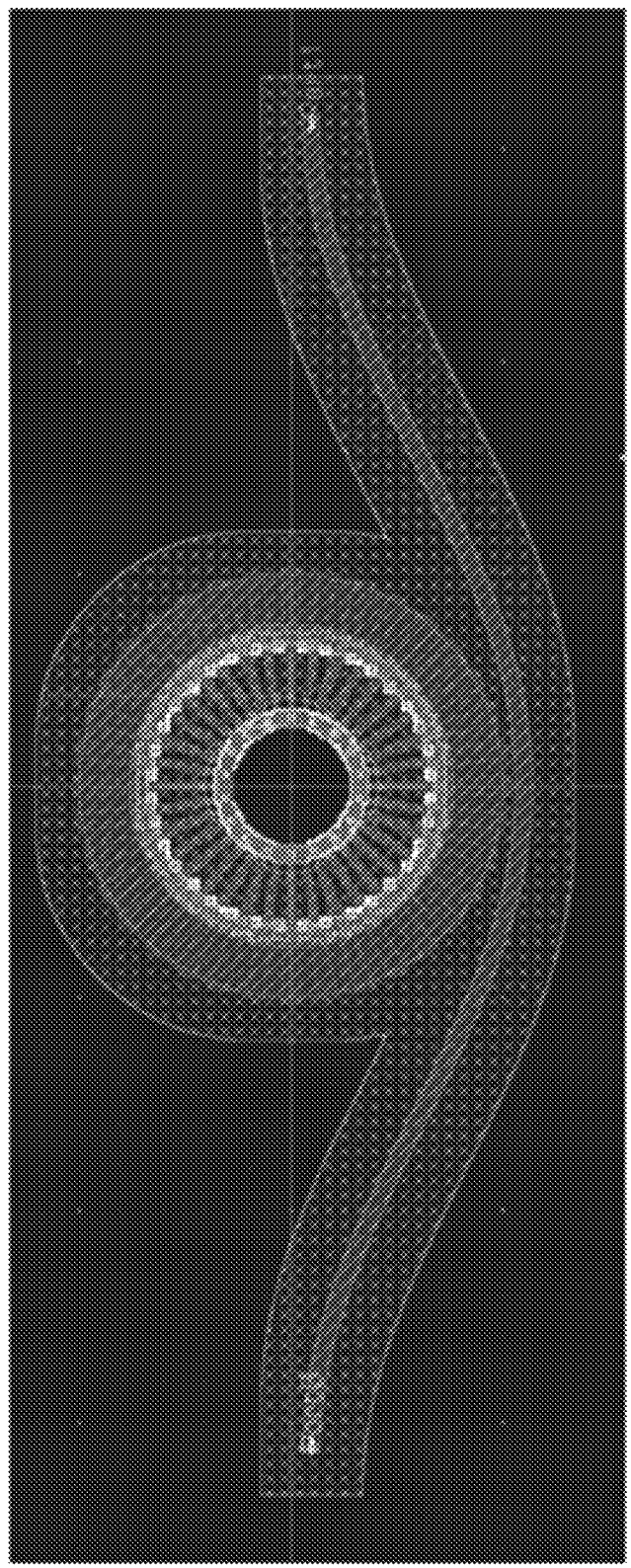
FIG. 17 is a rendering of a spoke-ring optical modulator photonic pCell, according to some embodiments.

FIG. 17 is a rendering of a DRC-clean spoke-ring modulator pCell, according to some embodiments. FIG. 18 is a rendering including a spoke-ring modulator pCell and a dense metal fill pattern for avoiding density violations, with an inset showing the, pCell parameter list, according to some embodiments. As shown in the parameter list of FIG. 18, the modulator includes 36 spokes (SpokeN=36), a width of 1.200 (RingWidth=1.200; difference between the outer and inner radius of the ring) and a slot width of 0.278 (SlotWidth=0.278; the minimum gap left between the ring and the waveguide), the waveguide has a width of 0.400 (WgWidth=0.400; the width of the access waveguide), and n-wells and p-wells are defined by respective lists.

Figure 19:
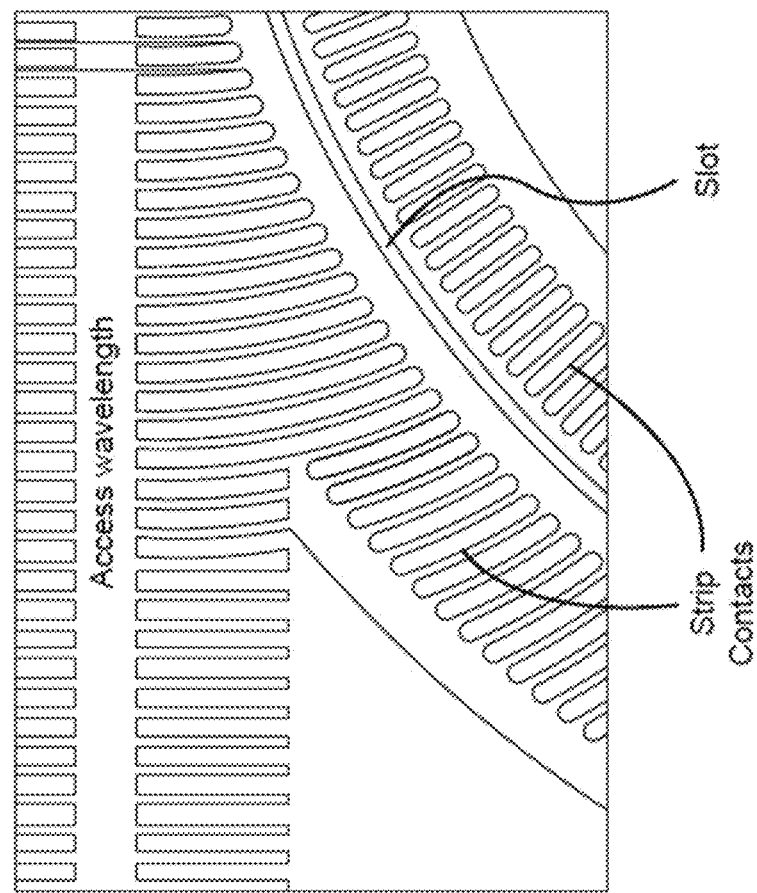
FIG. 19 is a rendering of a slotted ring optical resonator having strip contacts, according to some embodiments.

FIG. 19 is a rendering of a DRC-clean slotted ring resonator having sub-wavelength silicon strip electrical contacts, according to some embodiments. The strip contacts are orthogonal to both the ring and the access waveguide, and are obtained by integrating a two-dimensional field.

Figure 20:
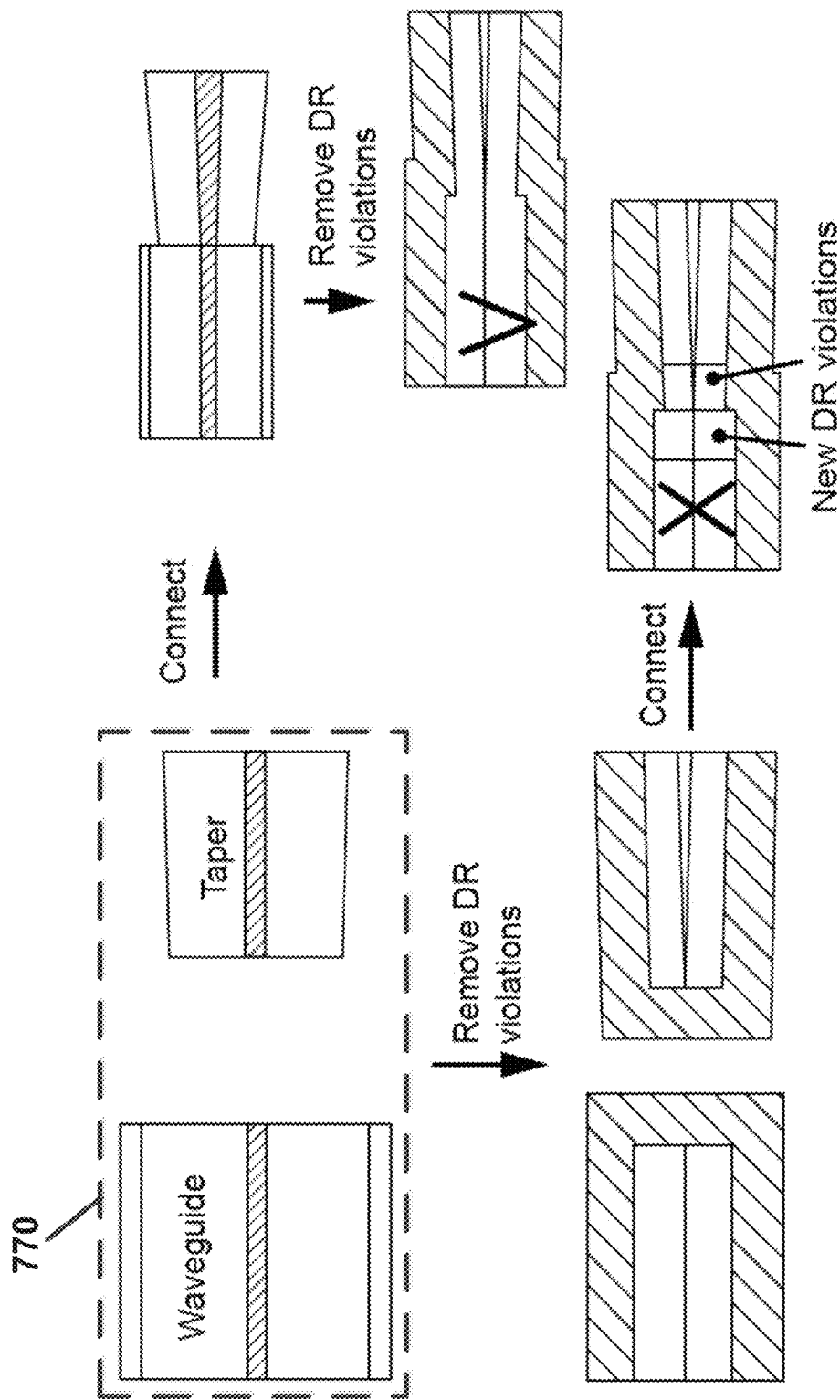
FIG. 20 is a sequence of renderings showing approaches for connecting a waveguide to a taper, according to some embodiments.

FIG. 20 is a sequence of renderings showing approaches for connecting a waveguide to a taper, according to some embodiments. As in other instances discussed above, cleaning a design for a waveguide-to-taper transition from DRC violations can advantageously be performed after connecting the components (the waveguide and the taper) together. As illustrated by FIG. 20, removing DRC violations from connected devices (following the clockwise path in FIG. 20, beginning at box 770) yields a different result (i.e., a DRC clean result) than connecting devices that are already DRC-clean (following the counter-clockwise path in FIG. 20, beginning at box 770). In the latter example, while DRC-clean optical waveguides and/or tapers may be surrounded by a fill layer in advance (e.g., to ensures that local material density rules are met), overlap of such layers results in a DRC violation.

Automated Waveguide Port Alignment

The automated waveguide port alignment (one of the plurality of processor-executable photonics design functions described above with reference to FIG. 1) can be described as follows: A designer, when designing a physical property layer, can assemble the physical property layer piece by piece (i.e., pCell by pCell). Suppose the designer has already drawn a ring and an access waveguide, and now would like to connect a grating coupler at the beginning of the access waveguide. A port number is displayed at the beginning of the access waveguide, for example "Port 37." This number can depend, for example, on the history of how the physical property layer was designed. There is a port number because the pCell (for example of the access waveguide) has been assigned a port (e.g., by the pCell author/designer) at any location where a port is expected. The designer opens the pCell of a grating coupler, and observes the post number where the desired connection is to be made (e.g., "Port 1"). The automated waveguide port alignment then instructs, via SKILL code, movement or repositioning of the grating coupler within the design such that its Port 1 faces the Port 37 of the existing physical property layer. The code then calculates the rotation/translation/mirroring necessary to do that and makes an instantiation. Subsequently, the designer can elect to "update" the ports, invoking the code to eliminate all paired ports. In other words, once a port is facing another port, no further devices will be placed there, and hence that port can be deleted. The remaining ports can be re-numbered in order of appearance.

Figure 21:
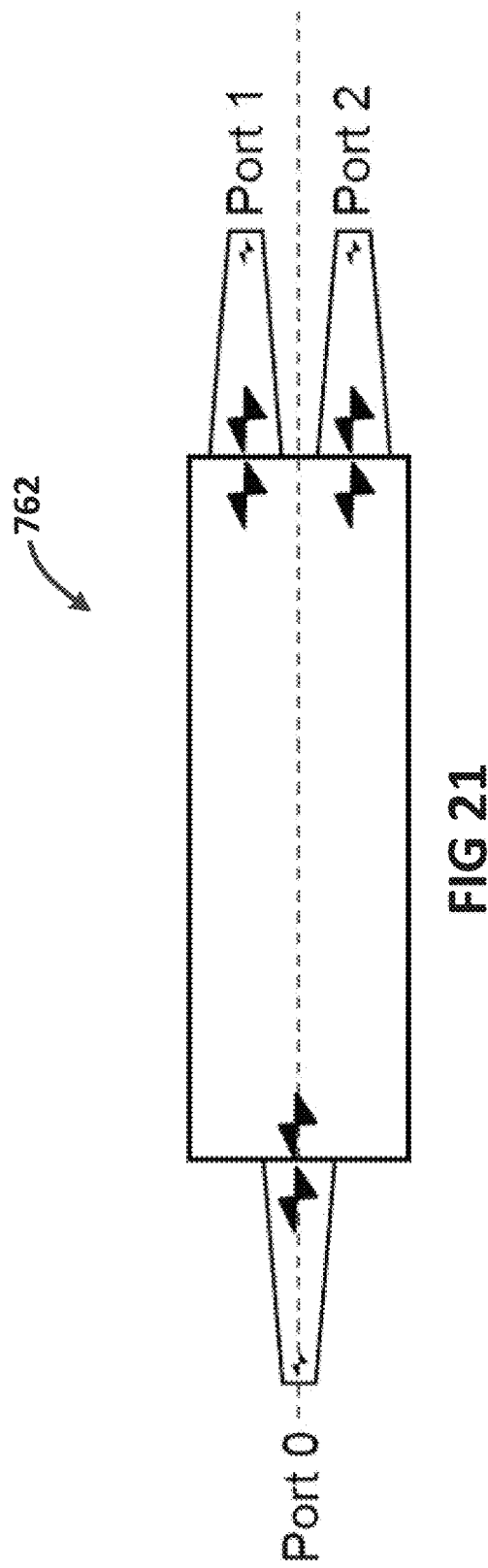
FIG. 21 is a rendering of a multi-mode interference coupler, according to some embodiments.
Figure 22:
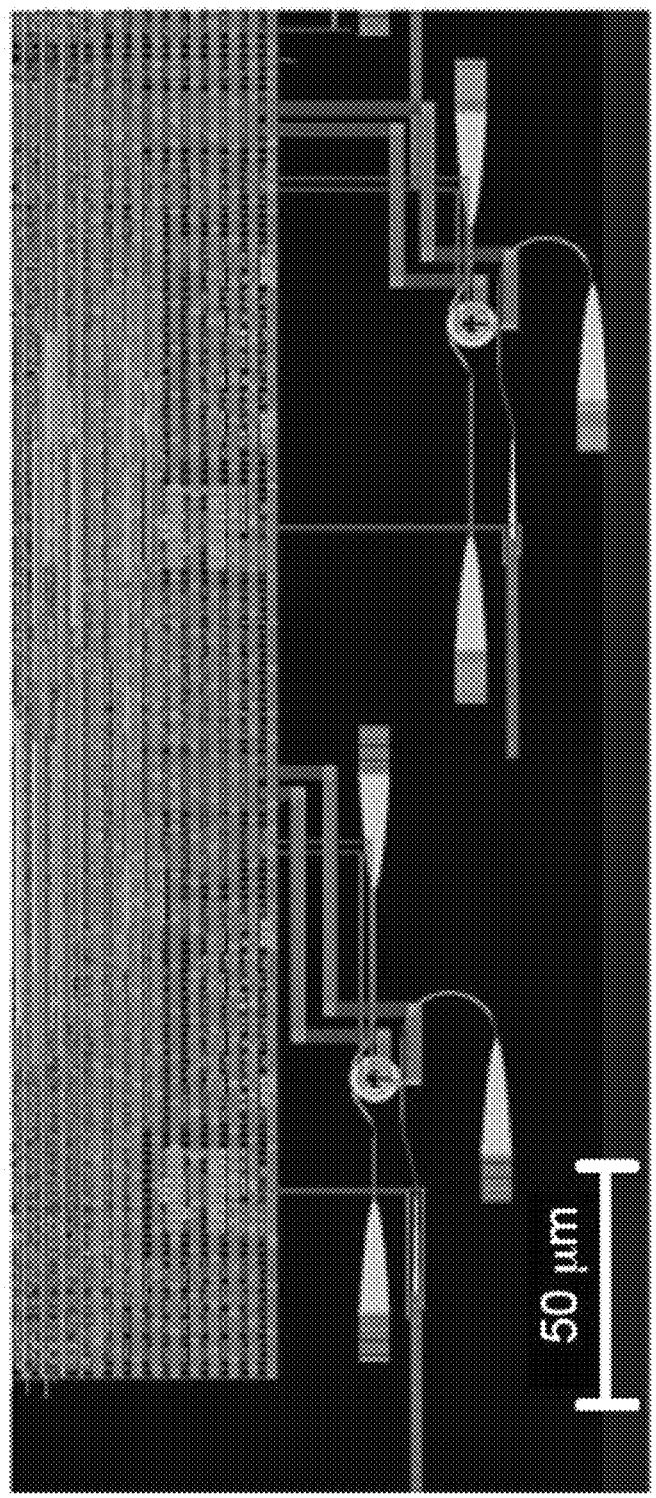
FIG. 22 is a rendering showing electrical and optical routing, according to some embodiments.

FIG. 21 is a rendering of a multi-mode interference coupler, according to some embodiments, illustrating the port functionality of the PDA tool. As shown in FIG. 21, the multi-mode interference coupler is built using a rectangle and three tapers. Each of the rectangle and the tapers includes one or more optical ports (see the bowtie-shaped regions in FIG. 21). In one example, the ports are connected automatically by specifying port pairs. In other words, photonic components are conveniently connected together by matching waveguides ports. A waveguide port is defined as a list containing the port location, its orientation, its identifier (e.g. is name), its layer, and its width. According to embodiments of the present disclosure, a procedure (e.g., written in SKILL) allows for the connecting of two ports together (including performing the necessary translation and rotations of the objects) by specifying the identity of the port pair (see FIG. 21). In some embodiments, the PDA tool also includes an auto-routing procedure that automatically defines a waveguide based on the input and output ports. For example, the code may implement straight, sinusoidal and/or circular waveguides as appropriate. In some embodiments, an algorithm first defines a path connecting the ports (i.e., a one-dimensional array of points), and then generates a waveguide from it using a 'path-to-waveguide' procedure. In some cases, electrical pins already defined by the native EDA environment (e.g., standard SKILL-defined electrical pins) are exploited on the optical devices as well, for example allowing Cadence® to perform electrical auto-routing as with normal transistors (see FIG. 22). As such, the functionality of EDA tools such as Cadence® can be extended by embodiments of the PDA tool described herein, to allow both electrical and optical routing in a single environment. FIG. 22 is a rendering showing an example of such electrical and optical routing. Electro-optic components of FIG. 22, e.g., modulators and detectors, include electrical pins that are automatically routed to a microprocessor (e.g., by Cadence®). The optical components (e.g., waveguides) are connected together using the photonic port and auto-routing functionalities of the PDA tool disclosed herein. The full processing time (for waveguide routing, layer generation and DRC cleaning) of the photonic components in the image of FIG. 22 is <80 seconds on a single logic CPU (out of the eight available) of a single Intel® Xeon X5550 processor at 2.7 GHz clock frequency.

Figure 23:
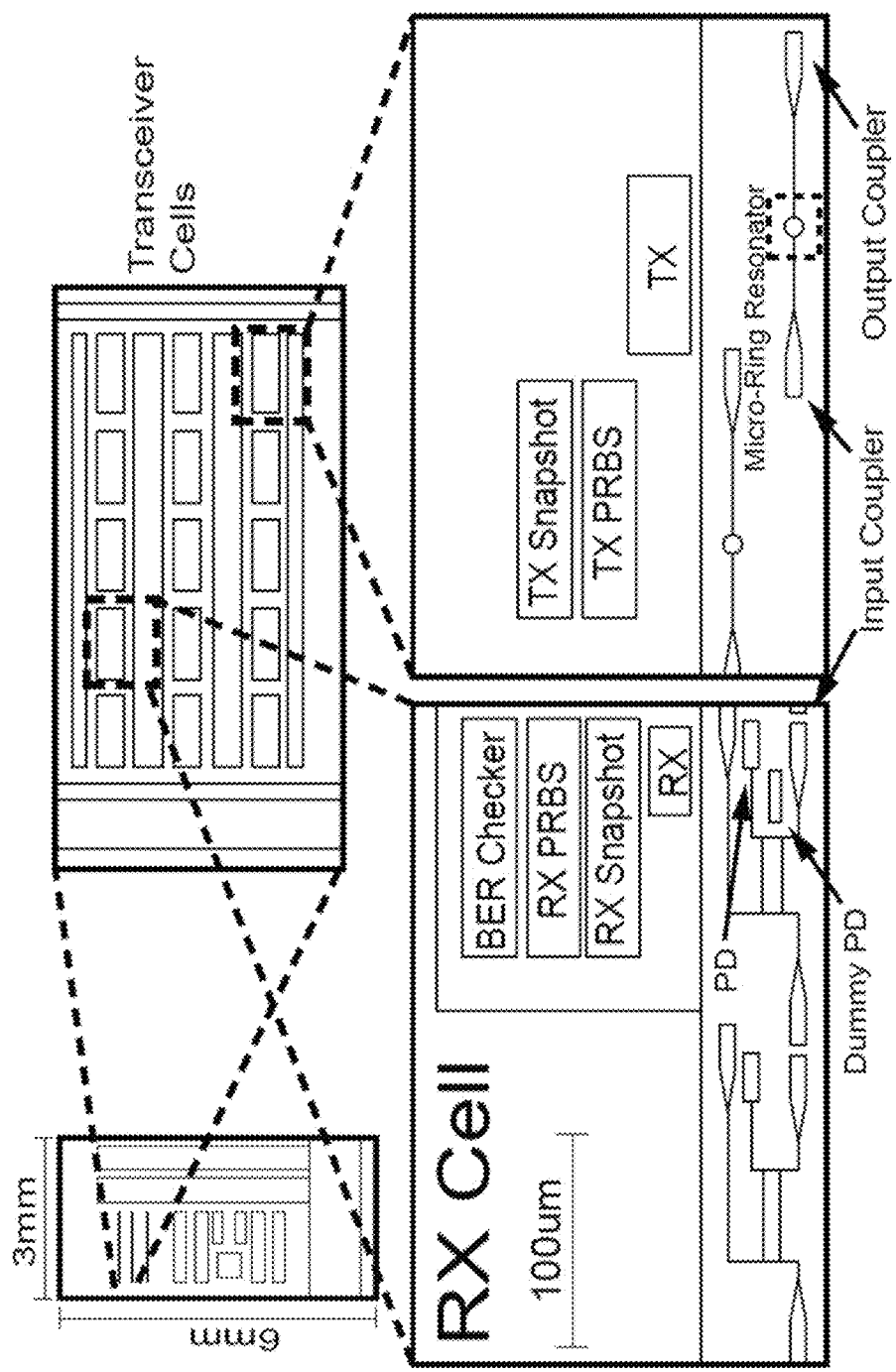
FIG. 23 is a diagrammed photograph of a design for an optical transceiver integrated with electrical circuits, according to some embodiments.

FIG. 23 is a diagrammed photograph of an optical transceiver integrated with electrical circuits, according to some embodiments. The optical transceiver is monolithically integrated with million-transistor electrical circuits in 45 nm 12SOI IBM technology without requiring any changes to the fabrication process flow (a paradigm referred to herein as 'zero-change CMOS' photonics). The full 3 mm×6 mm die comprises individual transmit/receive cells, each containing a pseudorandom binary sequence (PRBS) generator, modulator driver, feedback loop for tuning the ring resonance, a spoked-ring carrier-depletion modulator, silicon germanium (SiGe) detector, an electrical driver with serializer, a transimpedance amplifier and a digital back-end with a samplingscope and bit-error-ratio (BER) tester functionality. The transmit/receive blocks operate with an electrical power consumption of <0.3 pJ/bit at a data rate of 3.5 Gb/s and 2.5 Gb/s, respectively.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of designing and making the coupling structures and diffractive optical elements disclosed herein may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes (e.g., of designing and making the coupling structures and diffractive optical elements disclosed above) outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An apparatus to facilitate design of semiconductor photonic devices, the apparatus comprising:
    at least one user interface including at least one display device;
    at least one processor communicatively coupled to the at least one user interface; and
    a memory coupled to the at least one processor, the memory having electronically stored therein:
        a photonics process design library of photonics parameterized cells (pCells);
        a plurality of processor-executable photonics design functions including a design rule check (DRC) violation removal function; and
        a semiconductor technology-dependent parameter file including a plurality of design rules that define allowed semiconductor design patterns to be converted to a plurality of semiconductor fabrication mask designs in a first semiconductor technology,
    wherein upon execution by the at least one processor of at least some of the processor-executable photonics design functions, the at least one processor:
        A) controls the at least one user interface and the at least one display device to facilitate electronic access to the library of photonics pCells to create a plurality of physical property layers for a first photonic device; and
        B) processes the plurality of physical property layers using the DRC violation removal function and at least some of the plurality of design rules in the semiconductor technology-dependent parameter file to automatically generate a plurality of mask design layers for a physical layout of the first photonic device in the first semiconductor technology, such that the plurality of mask design layers substantially avoid DRC violations in the first semiconductor technology,
    wherein:
        in A), at least one physical property layer of the plurality of physical property layers for the first photonic device is created to include at least one element having an arbitrary shape; and
        in B), the processor processes the at least one physical property layer including the at least one element having the arbitrary shape to convert the arbitrary shape into at least one orthogonal polygon.

2. The apparatus of claim 1, wherein in B), the processor processes the plurality of physical property layers such that the plurality of mask design layers do not include any DRC violations in the first semiconductor technology.

3. The apparatus of claim 1, wherein in A), the processor further controls the at least one user interface and the at least one display device to facilitate creation of at least one new photonics pCell and storage of the at least one new photonics pCell in the photonic process design library.

4. The apparatus of claim 1, wherein the photonics process design library of photonics pCells is arranged in a plurality of hierarchical levels comprising:
    a first level including a plurality of photonic basic element pCells;
    a second level including a plurality of photonic device pCells; and
    a third level including a plurality of photonic block and assembly pCells.

5. The apparatus of claim 4, wherein the plurality of photonic basic element pCells includes:
an undoped crystalline silicon layer;
an undoped polysilicon layer;
a solitary n-well implant layer; and
an undoped silicon germanium (SiGe) layer.

6. The apparatus of claim 1, wherein:
in A), the at least one processor controls the at least one user interface and the at least one display device to facilitate electronic access to the library of photonics pCells to create the plurality of physical property layers for the first photonic device, at least one second photonic device, and at least one interconnection between the first photonic device and the at least one second photonic device; and
in B), the at least one processor processes the plurality of physical property layers using the DRC violation removal function and the at least some of the plurality of design rules in the semiconductor technology-dependent parameter file to automatically generate the plurality of mask design layers for the physical layout of the first photonic device, the at least one second photonic device, and the at least one interconnection in the first semiconductor technology, such that the plurality of mask design layers substantially avoid DRC violations in the first semiconductor technology.

7. The apparatus of claim 1, wherein the first semiconductor technology is a 45 nanometer CMOS silicon-on-insulator process technology.

8. The apparatus of claim 1, wherein the first photonic device is a zero-change CMOS photonic device.

9. The apparatus of claim 1, wherein:
the memory further has electronically stored therein a plurality of computer-executable instructions to implement the Virtuoso electronics design automation (EDA) tool by Cadence®; and
the library of photonics pCells, the plurality of processor-executable photonics design functions, and the semiconductor technology-dependent parameter file are written in the SKILL scripting language.

10. The apparatus of claim 1, wherein:
in A), at least one physical property layer of the plurality of physical property layers for the first photonic device is created to include at least one curved structure; and
in B), the processor processes the at least one physical property layer including the at least one curved structure so as to automatically generate at least some of the plurality of mask design layers for the physical layout of the first photonic device.

11. The apparatus of claim 10, wherein the at least one curved structure includes at least one ring structure.

12. The apparatus of claim 1, wherein:
in A), at least one physical property layer of the plurality of physical property layers for the first photonic device is created to include at least one polygon; and
in B), the processor processes the at least one physical property layer including the at least one polygon so as to automatically generate at least some of the plurality of mask design layers for the physical layout of the first photonic device.

13. The apparatus of claim 12, wherein:
in A), the at least one polygon is defined by more than 4000 points; and
in B), the processor processes the at least one physical property layer to tile the at least one polygon defined by more than 4000 points into a plurality of sub-polygons, wherein each sub-polygon of the plurality of sub-polygons is defined by less than 4000 points.

14. The apparatus of claim 12, wherein:
in A), the at least one polygon is at least one non-orthogonal polygon; and
in B), the processor:
processes the at least one physical property layer including the at least one non-orthogonal polygon to convert the non-orthogonal polygon into at least one orthogonal polygon in the at least one physical property layer; and
processes the at least one physical property layer including the at least one orthogonal polygon so as to automatically generate at least some of the plurality of mask design layers for the physical layout of the first photonic device.

15. The apparatus of claim 14, wherein in B), the at least one orthogonal polygon includes a plurality of orthogonal segments on a grid having a first pitch.

16. The apparatus of claim 15, wherein the first pitch of the grid is 1 nanometer.

17. The apparatus of claim 14, wherein:
a first design rule of the plurality of design rules included in the semiconductor technology-dependent parameter file specifies a minimum dimension requirement for the at least one physical property layer including the at least one orthogonal polygon; and
in B), the at least one processor processes the at least one physical property layer using the DRC violation removal function and at least the first design rule so as to enlarge and diminish dimensions of the at least one orthogonal polygon to thereby generate at least one transformed orthogonal polygon, wherein all opposite edges of the at least one transformed orthogonal polygon are separated by at least the minimum dimension requirement.

18. The apparatus of claim 17, wherein:
the minimum dimension requirement is a minimum space requirement represented by a parameter 2d; and
in B), the at least one processor processes the at least one physical property layer using the DRC violation removal function and at least the first design rule to:
B1) increase a first size of the at least one orthogonal polygon by translating orthogonal segments of the at least one orthogonal polygon by a first distance d to generate at least one first re-sized orthogonal polygon having a second size; and
B2) after B1), decrease the second size of the first re-sized orthogonal polygon by translating orthogonal segments of the at least one first re-sized orthogonal polygon by a second distance -d to generate at least one second re-sized orthogonal polygon.

19. The apparatus of claim 17, wherein:
the minimum dimension requirement is a minimum feature size requirement represented by a parameter 2d; and
in B), the at least one processor processes the at least one physical property layer using the DRC violation removal function and at least the first design rule to:
B1) decrease a first size of the at least one orthogonal polygon by translating orthogonal segments of the at least one orthogonal polygon by a first distance d to generate at least one first re-sized orthogonal polygon having a second size; and
B2) after B1), increase the second size of the first re-sized orthogonal polygon by translating orthogonal segments of the at least one first re-sized orthogonal polygon by a second distance -d to generate at least one second re-sized orthogonal polygon.

20. The apparatus of claim 1, wherein:
in A), at least one of the photonics pCells is selected to provide at least a first waveguide port represented in at least one physical property layer of the plurality of physical property layers for the first photonic device; and
in B), the processor processes the at least one physical property layer including the first waveguide port so as to automatically generate at least some of the plurality of mask design layers for the physical layout of the first photonic device.

21. The apparatus of claim 20, wherein the at least one of the photonics pCells selected to provide the first waveguide port is defined as a list comprising:
a port location of the first waveguide port;
an orientation of the first waveguide port;
a name for the first waveguide port;
an identifier for the at least one physical property layer in which the first waveguide port is represented; and
a width of the first waveguide port.

22. The apparatus of claim 20, wherein the plurality of processor-executable photonics design functions electronically stored in the memory further include:
an automated waveguide generation function; and
an automated waveguide port alignment function.

23. The apparatus of claim 22, wherein:
in A), the at least one processor controls the at least one user interface and the at least one display device to facilitate electronic access to the library of photonics pCells to create the plurality of physical property layers for the first photonic device including the first waveguide port, and at least one second photonic device including a second waveguide port; and
in B) the at least one processor processes the plurality of physical property layers using the automated waveguide generation function and the automated waveguide port alignment function to automatically define a waveguide between the first waveguide port and the second waveguide port.

24. The apparatus of claim 1, wherein:
at least one photonics pCell in the library of photonics pCells includes a silicon germanium (SiGe) layer;
in A), the first photonic device includes the SiGe layer; and
the plurality of design rules in the semiconductor-technology dependent parameter file include a maximum width of the SiGe layer.

25. A method for computer-facilitated design of semiconductor photonic devices, the method comprising:
A) providing a photonics process design library of photonic parameterized cells (pCells) to facilitate design, via a graphical user interface, of a plurality of physical property layers for a first photonic device; and
B) electronically processing the plurality of physical property layers using:
a design rule check (DRC) violation removal function; and
a semiconductor technology-dependent parameter file including a plurality of design rules that define allowed semiconductor design patterns to be converted to a plurality of semiconductor fabrication mask designs in a first semiconductor technology used to make the first photonic device,
to automatically generate a plurality of mask design layers for a physical layout of the first photonic device in the first semiconductor technology, such that the plurality of mask design layers substantially avoid DRC violations in the first semiconductor technology,
wherein:
in A), at least one physical property layer of the plurality of physical property layers for the first photonic device is created to include at least one element having an arbitrary shape; and
B) comprises electronically processing the at least one physical property layer including the at least one element having the arbitrary shape to convert the arbitrary shape into at least one orthogonal polygon.

26. The method of claim 25, wherein B) comprises:
electronically processing the plurality of physical property layers including the at least one converted physical property layer such that the plurality of mask design layers do not include any DRC violations in the first semiconductor technology.

27. The method of claim 25, wherein in A), the method further comprises:
facilitating creation, via the graphical user interface, of at least one new photonics pCell; and
storing the at least one new photonics pCell in the photonic process design library.

28. The method of claim 25, wherein the photonics process design library of photonics pCells is arranged in a plurality of hierarchical levels comprising:
a first level including a plurality of photonic basic element pCells;
a second level including a plurality of photonic device pCells; and
a third level including a plurality of photonic block and assembly pCells.

29. The method of claim 28, wherein the plurality of photonic basic element pCells includes:
an undoped crystalline silicon layer;
an undoped polysilicon layer;
a solitary n-well implant layer; and
an undoped silicon germanium (SiGe) layer.

30. The method of claim 25, wherein:
A) comprises facilitating design, via the graphical user interface, of the plurality of physical property layers for the first photonic device, at least one second photonic device, and at least one interconnection between the first photonic device and the at least one second photonic device; and
B) comprises electronically processing the plurality of physical property layers using the DRC violation removal function and the at least some of the plurality of design rules in the semiconductor technology-dependent parameter file to automatically generate the plurality of mask design layers for the physical layout of the first photonic device, the at least one second photonic device, and the at least one interconnection in the first semiconductor technology, such that the plurality of mask design layers substantially avoid DRC violations in the first semiconductor technology.

31. The method of claim 25, wherein the first semiconductor technology is a 45 nanometer CMOS silicon-on-insulator process technology.

32. The method of claim 25, wherein the first photonic device is a zero-change CMOS photonic device.

33. The method of claim 25, wherein:
A) further comprises providing a plurality of computer-executable instructions to implement the Virtuoso electronics design automation (EDA) tool by Cadence®; and the library of photonics pCells, the plurality of processor-executable photonics design functions, and the semiconductor technology-dependent parameter file are written in the SKILL scripting language.

34. The method of claim 25, wherein:
in A), at least one physical property layer of the plurality of physical property layers for the first photonic device is created to include at least one curved structure; and
B) comprises electronically processing the at least one physical property layer including the at least one curved structure so as to automatically generate at least some of the plurality of mask design layers for the physical layout of the first photonic device.

35. The method of claim 34, wherein the at least one curved structure includes at least one ring structure.

36. The method of claim 25, wherein:
in A), at least one physical property layer of the plurality of physical property layers for the first photonic device is created to include at least one polygon; and
B) comprises electronically processing the at least one physical property layer including the at least one polygon so as to automatically generate at least some of the plurality of mask design layers for the physical layout of the first photonic device.

37. The method of claim 36, wherein:
in A), the at least one polygon is defined by more than 4000 points; and
B) comprises electronically processing the at least one physical property layer to tile the at least one polygon defined by more than 4000 points into a plurality of sub-polygons, wherein each sub-polygon of the plurality of sub-polygons is defined by less than 4000 points.

38. The method of claim 36, wherein:
in A), the at least one polygon is at least one non-orthogonal polygon; and
B) comprises:
electronically processing the at least one physical property layer including the at least one non-orthogonal polygon to convert the non-orthogonal polygon into at least one orthogonal polygon in the at least one physical property layer; and
electronically processing the at least one physical property layer including the at least one orthogonal polygon so as to automatically generate at least some of the plurality of mask design layers for the physical layout of the first photonic device.

39. The method of claim 38, wherein in B), the at least one orthogonal polygon includes a plurality of orthogonal segments on a grid having a first pitch.

40. The method of claim 39, wherein the first pitch of the grid is 1 nanometer.

41. The method of claim 38, wherein:
a first design rule of the plurality of design rules included in the semiconductor technology-dependent parameter file specifies a minimum dimension requirement for the at least one physical property layer including the at least one orthogonal polygon; and
B) comprises electronically processing the at least one physical property layer using the DRC violation removal function and at least the first design rule so as to enlarge and diminish dimensions of the at least one orthogonal polygon to thereby generate at least one transformed orthogonal polygon, wherein all opposite edges of the at least one transformed orthogonal polygon are separated by at least the minimum dimension requirement.

42. The method of claim 41, wherein:
the minimum dimension requirement is a minimum space requirement represented by a parameter 2d; and
B) comprises electronically processing the at least one physical property layer using the DRC violation removal function and at least the first design rule to:
B1) increase a first size of the at least one orthogonal polygon by translating orthogonal segments of the at least one orthogonal polygon by a first distance d to generate at least one first re-sized orthogonal polygon having a second size; and
B2) after B1), decrease the second size of the first re-sized orthogonal polygon by translating orthogonal segments of the at least one first re-sized orthogonal polygon by a second distance -d to generate at least one second re-sized orthogonal polygon.

43. The method of claim 41, wherein:
the minimum dimension requirement is a minimum feature size requirement represented by a parameter 2d; and
B) comprises electronically processing the at least one physical property layer using the DRC violation removal function and at least the first design rule to:
B1) decrease a first size of the at least one orthogonal polygon by translating orthogonal segments of the at least one orthogonal polygon by a first distance d to generate at least one first re-sized orthogonal polygon having a second size; and
B2) after B1), increase the second size of the first re-sized orthogonal polygon by translating orthogonal segments of the at least one first re-sized orthogonal polygon by a second distance -d to generate at least one second re-sized orthogonal polygon.

44. The method of claim 25, wherein:
in A), at least one physical property layer of the plurality of physical property layers for the first photonic device includes at least a first waveguide port; and
B) comprises electronically processing the at least one physical property layer including the first waveguide port so as to automatically generate at least some of the plurality of mask design layers for the physical layout of the first photonic device.

45. The method of claim 44, wherein the at least one of the photonics pCells selected to provide the first waveguide port is defined as a list comprising:
a port location of the first waveguide port;
an orientation of the first waveguide port;
a name for the first waveguide port;
an identifier for the at least one physical property layer in which the first waveguide port is represented; and
a width of the first waveguide port.

46. The method of claim 44, wherein the plurality of processor-executable photonics design functions electronically stored in the memory further include:
an automated waveguide generation function; and
an automated waveguide port alignment function.

47. The method of claim 46, wherein:
in A), at least one physical property layer of the plurality of physical property layers for the first photonic device includes the first waveguide port, and at least one second photonic device including a second waveguide port; and
B) comprises electronically processing the plurality of physical property layers using the automated waveguide generation function and the automated waveguide port alignment function to automatically define a waveguide between the first waveguide port and the second waveguide port.

48. The method of claim 25, wherein:
at least one photonics pCell in the library of photonics pCells includes a silicon germanium (SiGe) layer;
in A), the first photonic device includes the SiGe layer; and
the plurality of design rules in the semiconductor-technology dependent parameter file include a maximum width of the SiGe layer.

49. A non-transitory computer-readable storage medium encoded with instructions that, when executed by at least one processor, perform a method for computer-facilitated design of semiconductor photonic devices, the method comprising:
A) providing a photonics process design library of photonic parameterized cells (pCells) to facilitate design, via a graphical user interface, of a plurality of physical property layers for a first photonic device; and
B) electronically processing the plurality of physical property layers using:
a design rule check (DRC) violation removal function; and
a semiconductor technology-dependent parameter file including a plurality of design rules that define allowed semiconductor design patterns to be converted to a plurality of semiconductor fabrication mask designs in a first semiconductor technology used to make the first photonic device,
to automatically generate a plurality of mask design layers for a physical layout of the first photonic device in the first semiconductor technology, such that the plurality of mask design layers substantially avoid DRC violations in the first semiconductor technology, wherein:
in A), at least one physical property layer of the plurality of physical property layers for the first photonic device is created to include at least one element having an arbitrary shape; and
B) comprises electronically processing the at least one physical property layer including the at least one element having the arbitrary shape to convert the arbitrary shape into at least one orthogonal polygon.

50. The storage medium of claim 49, further having stored thereon the photonics process design library of pCells including the DRC violation removal function.

51. The storage medium of claim 49, wherein in the method, B) comprises:
electronically processing the plurality of physical property layers including the at least one converted physical property layer such that the plurality of mask design layers do not include any DRC violations in the first semiconductor technology.

52. The storage medium of claim 49, wherein in A), the method further comprises:
facilitating creation, via the graphical user interface, of at least one new photonics pCell; and
storing the at least one new photonics pCell in the photonic process design library.

53. The storage medium of claim 49, further having stored thereon the photonics process design library, wherein the photonics process design library of photonics pCells is arranged in a plurality of hierarchical levels comprising:
a first level including a plurality of photonic basic element pCells;
a second level including a plurality of photonic device pCells; and
a third level including a plurality of photonic block and assembly pCells.

54. The storage medium of claim 53, wherein the plurality of photonic basic element pCells includes:
an undoped crystalline silicon layer;
an undoped polysilicon layer;
a solitary n-well implant layer; and
an undoped silicon germanium (SiGe) layer.

55. The storage medium of claim 49, wherein in the method:
A) comprises facilitating design, via the graphical user interface, of the plurality of physical property layers for the first photonic device, at least one second photonic device, and at least one interconnection between the first photonic device and the at least one second photonic device; and
B) comprises electronically processing the plurality of physical property layers using the DRC violation removal function and the at least some of the plurality of design rules in the semiconductor technology-dependent parameter file to automatically generate the plurality of mask design layers for the physical layout of the first photonic device, the at least one second photonic device, and the at least one interconnection in the first semiconductor technology, such that the plurality of mask design layers substantially avoid DRC violations in the first semiconductor technology.

56. The storage medium of claim 49, wherein the first semiconductor technology is a 45 nanometer CMOS silicon-on-insulator process technology.

57. The storage medium of claim 49, wherein the first photonic device is a zero-change CMOS photonic device.

58. The storage medium of claim 49, wherein:
in the method, A) further comprises providing a plurality of computer-executable instructions to implement the Virtuoso electronics design automation (EDA) tool by Cadence®; and
the library of photonics pCells, the plurality of processor-executable photonics design functions, and the semiconductor technology-dependent parameter file are written in the SKILL scripting language.

59. The storage medium of claim 49, wherein:
in A), at least one physical property layer of the plurality of physical property layers for the first photonic device is created to include at least one curved structure; and
B) comprises electronically processing the at least one physical property layer including the at least one curved structure so as to automatically generate at least some of the plurality of mask design layers for the physical layout of the first photonic device.

60. The storage medium of claim 59, wherein the at least one curved structure includes at least one ring structure.

61. The storage medium of claim 49, wherein:
in A), at least one physical property layer of the plurality of physical property layers for the first photonic device is created to include at least one polygon; and
B) comprises electronically processing the at least one physical property layer including the at least one polygon so as to automatically generate at least some of the plurality of mask design layers for the physical layout of the first photonic device.

62. The storage medium of claim 61, wherein:
in A), the at least one polygon is defined by more than 4000 points; and
B) comprises electronically processing the at least one physical property layer to tile the at least one polygon defined by more than 4000 points into a plurality of sub-polygons, wherein each sub-polygon of the plurality of sub-polygons is defined by less than 4000 points.

63. The storage medium of claim 61, wherein:
in A), the at least one polygon is at least one non-orthogonal polygon; and
B) comprises:
- electronically processing the at least one physical property layer including the at least one non-orthogonal polygon to convert the non-orthogonal polygon into at least one orthogonal polygon in the at least one physical property layer; and
- electronically processing the at least one physical property layer including the at least one orthogonal polygon so as to automatically generate at least some of the plurality of mask design layers for the physical layout of the first photonic device.

64. The storage medium of claim 63, wherein in B), the at least one orthogonal polygon includes a plurality of orthogonal segments on a grid having a first pitch.

65. The storage medium of claim 64, wherein the first pitch of the grid is 1 nanometer.

66. The storage medium of claim 63, wherein:
a first design rule of the plurality of design rules included in the semiconductor technology-dependent parameter file specifies a minimum dimension requirement for the at least one physical property layer including the at least one orthogonal polygon; and
B) comprises electronically processing the at least one physical property layer using the DRC violation removal function and at least the first design rule so as to enlarge and diminish dimensions of the at least one orthogonal polygon to thereby generate at least one transformed orthogonal polygon, wherein all opposite edges of the at least one transformed orthogonal polygon are separated by at least the minimum dimension requirement.

67. The storage medium of claim 66, wherein:
the minimum dimension requirement is a minimum space requirement represented by a parameter 2d; and
B) comprises electronically processing the at least one physical property layer using the DRC violation removal function and at least the first design rule to:
- B1) increase a first size of the at least one orthogonal polygon by translating orthogonal segments of the at least one orthogonal polygon by a first distance d to generate at least one first re-sized orthogonal polygon having a second size; and
- B2) after B1), decrease the second size of the first re-sized orthogonal polygon by translating orthogonal segments of the at least one first re-sized orthogonal polygon by a second distance -d to generate at least one second re-sized orthogonal polygon.

68. The storage medium of claim 66, wherein:
the minimum dimension requirement is a minimum feature size requirement represented by a parameter 2d; and
B) comprises electronically processing the at least one physical property layer using the DRC violation removal function and at least the first design rule to:
- B1) decrease a first size of the at least one orthogonal polygon by translating orthogonal segments of the at least one orthogonal polygon by a first distance d to generate at least one first re-sized orthogonal polygon having a second size; and
- B2) after B1), increase the second size of the first re-sized orthogonal polygon by translating orthogonal segments of the at least one first re-sized orthogonal polygon by a second distance -d to generate at least one second re-sized orthogonal polygon.

69. The storage medium of claim 49, wherein:
in A), at least one physical property layer of the plurality of physical property layers for the first photonic device includes at least a first waveguide port; and
B) comprises electronically processing the at least one physical property layer including the first waveguide port so as to automatically generate at least some of the plurality of mask design layers for the physical layout of the first photonic device.

70. The storage medium of claim 69, wherein the at least one of the photonics pCells selected to provide the first waveguide port is defined as a list comprising:
a port location of the first waveguide port;
an orientation of the first waveguide port;
a name for the first waveguide port;
an identifier for the at least one physical property layer in which the first waveguide port is represented; and
a width of the first waveguide port.

71. The storage medium of claim 49, wherein the plurality of processor-executable photonics design functions electronically stored in the memory further include:
an automated waveguide generation function; and
an automated waveguide port alignment function.

72. The storage medium of claim 71, wherein:
in A), at least one physical property layer of the plurality of physical property layers for the first photonic device includes the first waveguide port, and at least one second photonic device including a second waveguide port; and
B) comprises electronically processing the plurality of physical property layers using the automated waveguide generation function and the automated waveguide port alignment function to automatically define a waveguide between the first waveguide port and the second waveguide port.

73. The storage medium of claim 49, wherein:
at least one photonics pCell in the library of photonics pCells includes a silicon germanium (SiGe) layer;
in A), the first photonic device includes the SiGe layer; and
the plurality of design rules in the semiconductor-technology dependent parameter file include a maximum width of the SiGe layer.

* * * * *